United States Patent
Huang et al.

(10) Patent No.: US 12,425,019 B2
(45) Date of Patent: Sep. 23, 2025

(54) SENSING CIRCUIT AND SENSING METHOD THEREOF, SENSOR CHIP, AND DISPLAY PANEL

(71) Applicant: Shanghai Tianma Micro-Electronics Co., Ltd., Shanghai (CN)

(72) Inventors: Yukun Huang, Shanghai (CN); Linzhi Wang, Shanghai (CN); Kerui Xi, Shanghai (CN); Baiquan Lin, Shanghai (CN); Zhenyu Jia, Shanghai (CN); Aowen Li, Shanghai (CN); Haotian Lu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 328 days.

(21) Appl. No.: 18/351,282

(22) Filed: Jul. 12, 2023

(65) Prior Publication Data
US 2023/0361769 A1    Nov. 9, 2023

(30) Foreign Application Priority Data
Apr. 14, 2023    (CN) .......................... 202310403111.6

(51) Int. Cl.
H03K 17/56    (2006.01)
G01D 11/00    (2006.01)

(52) U.S. Cl.
CPC ............ H03K 17/56 (2013.01); G01D 11/00 (2013.01)

(58) Field of Classification Search
CPC ............................... H03K 17/56; G01D 11/00
USPC ....................................................... 324/537
See application file for complete search history.

(56) References Cited

U.S. PATENT DOCUMENTS

| 2018/0011053 A1 | 1/2018 | Hadwen et al. |
| 2018/0130418 A1 | 5/2018 | Zhu et al. |
| 2021/0232795 A1* | 7/2021 | Zhang ............... G06V 40/1306 |

FOREIGN PATENT DOCUMENTS

| CN | 207366099 U | 5/2018 |
| CN | 113892133 A | 1/2022 |
| CN | 115541685 A | 12/2022 |

OTHER PUBLICATIONS

Office Action mailed Jul. 25, 2025, issued in corresponding Chinese Application No. 202310403111.6, filed Apr. 14, 2023, 29 pages.

* cited by examiner

*Primary Examiner* — Stephanie E Bloss
*Assistant Examiner* — Michael A Harrison
(74) *Attorney, Agent, or Firm* — CHRISTENSEN O'CONNOR JOHNSON KINDNESS PLLC

(57) ABSTRACT

Provided are a sensing circuit and a sensing method thereof, a sensor chip, and a display panel. The sensing circuit includes a first transistor including a first gate and a second gate, a first capacitor, a read circuit, and a bias compensation circuit. The first gate receives a sensing signal outputted by a sensor. The first capacitor is connected between the second gate and a first fixed potential signal terminal. The read circuit is connected between the first transistor and an output terminal of the sensing circuit. The bias compensation circuit is electrically connected to the first transistor and configured to input a bias voltage into the second gate of the first transistor. The bias voltage received by the second gate reduce the threshold voltage drift of the first transistor.

20 Claims, 25 Drawing Sheets

US 12,425,019 B2

1

SENSING CIRCUIT AND SENSING METHOD THEREOF, SENSOR CHIP, AND DISPLAY PANEL

CROSS-REFERENCE TO RELATED APPLICATIONS

The present application claims priority to Chinese Patent Application No. 202310403111.6, filed on Apr. 14, 2023, the content of which is incorporated herein by reference in its entirety.

TECHNICAL FIELD

The present disclosure relates to the technical field of sensors, and in particular, to a sensing circuit and a sensing method thereof, a sensor chip, and a display panel.

BACKGROUND

In the field of sensing technology, sensing sensitivity is an important indicator for determining performance of a sensing circuit. Conventionally, the sensing circuit employs a transistor as an element for converting and amplifying a sensing signal, detection sensitivity of the sensing circuit for the sensing signal is greatly affected due to threshold drift in the transistor.

SUMMARY

In view of this, embodiments of the present disclosure provide a sensing circuit and a sensing method thereof, a sensor chip, and a display panel.

According to one aspect of the present disclosure, a sensing circuit is provided. The sensing circuit includes a first transistor, a first capacitor, a read circuit, and a bias compensation circuit. The first transistor includes a channel region, a first gate, and a second gate. The first gate receives a sensing signal outputted by a sensor. The first capacitor includes a first plate electrically connected to the second gate of the first transistor, and a second plate electrically connected to a first fixed potential signal terminal. The read circuit is electrically connected to the first transistor and configured to control the first transistor to output a sensing current to an output terminal of the sensing circuit. The bias compensation circuit is electrically connected to the first transistor and configured to input a bias voltage into the second gate of the first transistor.

According to another aspect of the present disclosure, a sensing method of a sensing circuit is provided. The sensing method is used to sense, through the sensing circuit provided above, a sensing signal outputted by a sensor. The sensing method includes a plurality of working cycles. The plurality of working cycles include at least one first working cycle. The first working cycle includes a bias compensation stage, an integration stage, and a read stage. At the bias compensation stage, the bias compensation circuit is turned on, and the bias voltage is inputted into the second gate of the first transistor. At the integration stage, both the bias compensation circuit and the read circuit are turned off, and the first gate of the first transistor receives the sensing signal outputted by the sensor. At the read stage, the read circuit is turned on, and the output terminal of the first transistor is electrically connected to the output terminal of the sensing circuit.

2

According to yet another aspect of the present disclosure, a sensor chip is provided. The sensor chip includes the sensing circuit provided above.

According to still another aspect of the present disclosure, a display panel is provided. The display panel includes the sensing circuit provided above.

BRIEF DESCRIPTION OF DRAWINGS

To describe the technical solutions of the embodiments of the present disclosure more clearly, the following briefly describes the accompanying drawings required in the embodiments. Apparently, the accompanying drawings in the following description show merely some examples of the present disclosure, and a person of ordinary skill in the art can still derive other drawings from these accompanying drawings without creative efforts.

DESCRIPTION OF EMBODIMENTS

For a better understanding of the technical solutions of the present disclosure, the following describes in detail the embodiments of the present disclosure with reference to the accompanying drawings.

It should be noted that, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Terms in the embodiments of the present disclosure are merely used to describe the specific embodiments, and are not intended to limit the present disclosure. Unless otherwise specified in the context, words, such as "a", "the", and "this", in a singular form in the embodiments and appended claims of the present disclosure include plural forms.

It should be understood that the term "and/or" in this specification merely describes associations between associated objects, and it indicates three types of relationships. For example, A and/or B may indicate that A exists alone, A and B coexist, or B exists alone. In addition, the character "/" in this specification generally indicates that the associated objects are in an "or" relationship.

In the description of this specification, it should be understood that the terms such as "substantially", "approximate to", "approximately", "about", "roughly", and "in general" described in the claims and embodiments of the present disclosure mean general agreement within a reasonable process operation range or tolerance range, rather than an exact value.

It should be understood that although the terms such as first, second, and third may be used to describe regions in the embodiments of the present disclosure, these regions should not be limited to these terms. These terms are used only to distinguish the regions from one another. For example, without departing from the scope of the embodiments of the present disclosure, a first region may also be referred to as a second region, and similarly, a second region may also be referred to as a first region.

Figure 1:
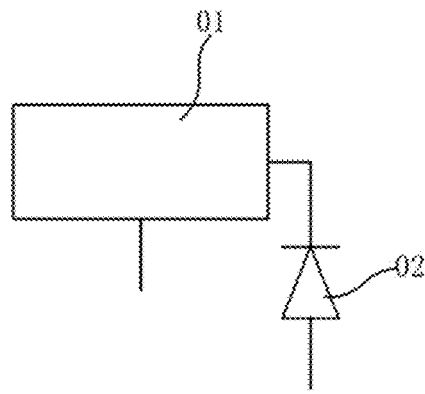
FIG. 1 is a schematic diagram of a sensor chip according to an embodiment of the present disclosure.

FIG. 1 is a schematic diagram of a sensor chip according to an embodiment of the present disclosure.

As shown in FIG. 1, the sensor chip includes a sensor 02 and a sensing circuit 01 electrically connected to the sensor 02. The sensing circuit 01 may also referred to as a read out circuit. The sensing circuit 01 receives a sensing signal outputted by the sensor 02, converts and amplifies the received sensing signal, and outputs a signal associated with the received sensing signal.

The sensor 02 includes, but is not limited to, a sensor for implementing functions such as pressure, temperature, optical, and biochemical/ion detection. In addition, the structure of the sensor 02 can vary with different functions implemented by the sensor 02. Correspondingly, the sensing circuit 01 may be connected to the sensor 02 in different manners. This is not limited in the present disclosure. For example, when the sensor 02 is an optical sensor, as shown in FIG. 1, the sensor 02 may be a photodiode, and the sensing circuit 01 may be electrically connected to a cathode of the photodiode.

Figure 2:
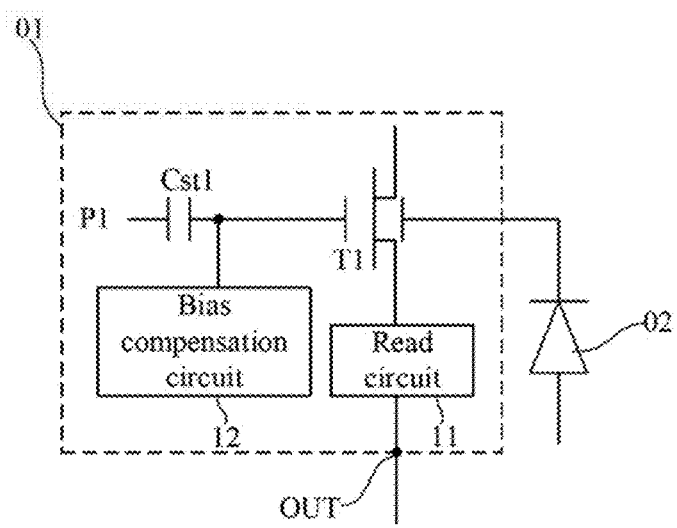
FIG. 2 is a schematic diagram of a sensing circuit according to an embodiment of the present disclosure.
Figure 3:
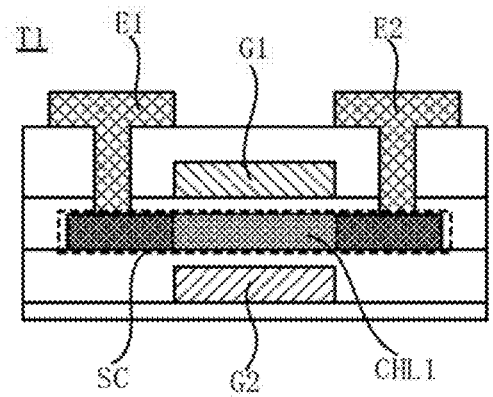
FIG. 3 is a schematic structural diagram of a first transistor in the sensing circuit shown in FIG. 2.

FIG. 2 is a schematic diagram of a sensing circuit according to an embodiment of the present disclosure. FIG. 3 is a schematic structural diagram of a first transistor in the sensing circuit shown in FIG. 2.

As shown in FIG. 2, the sensing circuit 01 includes a first transistor T1. With reference to FIG. 2 and FIG. 3, the first transistor T1 includes a channel region CHL1 and a first gate G1. The channel region CHL1 is located in a semiconductor layer SC. The first gate G1 overlaps the channel region CHL1 in the semiconductor layer SC.

The first gate G1 of the first transistor T1 receives a sensing signal outputted by the sensor 02. The first transistor T1 generates a detection current (also referred to as a sensing current) when receiving the sensing signal from the sensor 02, and the magnitude of the detection current depends on the magnitude of the sensing signal transmitted by the sensor 02 to the first gate G1 of the first transistor T1.

In addition, the sensing circuit 01 further includes a read circuit 11. The read circuit 11 is electrically connected to the first transistor T1 and configured to control the first transistor T1 to output a detection current to an output terminal OUT of the sensing circuit 01. That is, at a read stage of the operation of the sensing circuit 01, the read circuit 11 is turned on, and the detection current generated by the first transistor T1 is outputted to the output terminal OUT of the sensing circuit 01 through the read circuit 11.

The first transistor T1 further includes a first terminal E1 and a second terminal E2. The first terminal E1 may receive a fixed potential signal. The second terminal E2 may be electrically connected to the read circuit 11.

The sensing circuit 01 can perform signal conversion and amplification on the sensing signal outputted by the sensor 02. This is because the first transistor T1 has a capability of voltage-to-current conversion and amplification when the first transistor T1 is biased in a subthreshold region.

Figure 4:
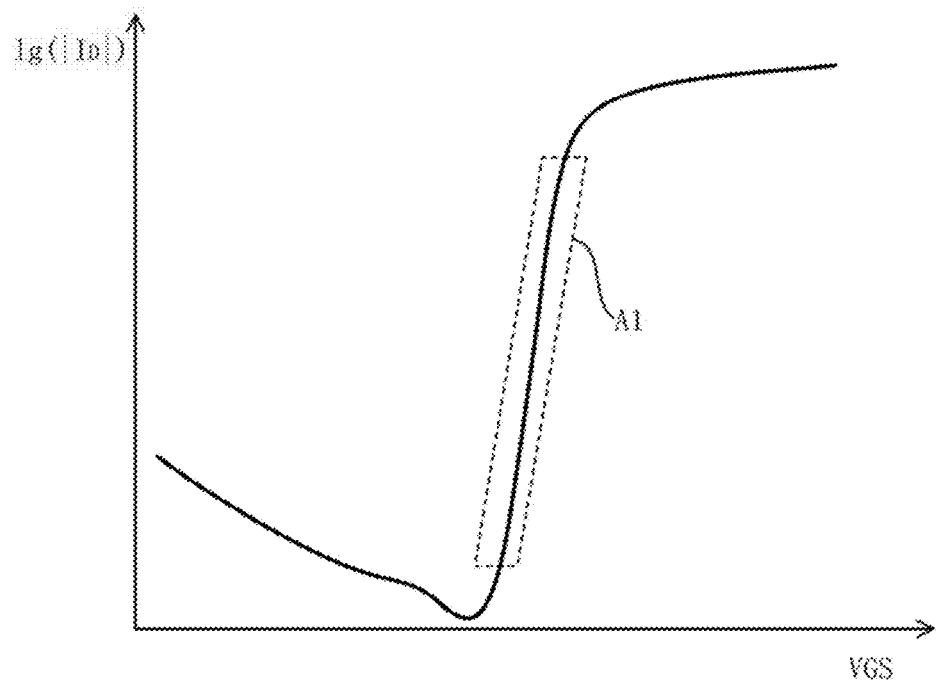
FIG. 4 is a transfer characteristic curve of a first transistor.

FIG. 4 is a transfer characteristic curve of the first transistor.

As shown in FIG. 4, when the first transistor T1 is biased in a subthreshold region A1, a current $I_D$ generated by the first transistor T1 rises exponentially with an increase in a gate-source voltage VGS of the first transistor T1, that is, a slight change in a gate voltage of the first transistor T1 may cause a great change in the current $I_D$ generated by the first transistor T1. At this time, a signal amplification capability of the first transistor T1 is excellent.

When a subthreshold swing of the first transistor T1 is relatively large, that is, the slope of the transfer characteristic curve of the first transistor T1 in the subthreshold region A1 is relatively small, the width of the subthreshold region A1 of the first transistor T1 is relatively large, but the signal amplification capability of the first transistor T1 is poor, causing detection sensitivity of the sensing circuit 01 to decrease correspondingly. It can be understood that the subthreshold region A1 of the first transistor T1 with a large subthreshold swing is still limited.

When the subthreshold swing of the first transistor T1 is relatively small, that is, the slope of the transfer characteristic curve of the first transistor T1 in the subthreshold region A1 is relatively steep, the first transistor T1 has a better signal amplification capability, but the width of the subthreshold region A1 of the first transistor T1 is smaller.

When the first transistor T1 is used as a sensing front end for amplifying a sensing signal in situ, a threshold drift of the first transistor T1 causes the subthreshold region A1 of the first transistor T1 to change.

For example, when the first transistor T1 receives different sensing signals outputted by the sensor 02, these different sensing signals cause different threshold drifts to the first transistor T1, such that the subthreshold region A1 of the first transistor T1 changes. In this case, when a sensing signal generated earlier among these sensing signals is transmitted to the first transistor T1, the first transistor T1 may work in the subthreshold region A1. However, when a sensing signal generated later among these sensing signals is transmitted to the first transistor T1, the first transistor T1 may not work in the subthreshold region A1. In this case, the sensitivity of the first transistor T1 changes, that is, the first transistor T1 has a reduced sensitivity in the working process.

In addition, the foregoing problem is particularly serious in the sensing circuit in which the first transistor T1 with a relatively small subthreshold swing is used. This is because the narrow subthreshold region A1 of the first transistor T1 with a relatively small subthreshold swing easily differs from the inherent subthreshold region A1 of the first transistor T1 due to threshold drift.

To resolve the foregoing problem, with reference to FIG. 2 and FIG. 3, the first transistor T1 in the sensing circuit 01 provided in this embodiment of the present disclosure further includes a second gate G2. The first gate G1 and the second gate G2 are located at two sides of the channel region CHL1 of the first transistor T1 respectively. It can be understood that the first transistor T1 is a double-gate transistor including a top gate and a bottom gate.

One of the first gate G1 and the second gate G2 may be a top gate of the first transistor T1 and the other one may be a bottom gate of the first transistor T1. In the example embodiment shown in FIG. 3, the first gate G1 of the first transistor T1 is the top gate, and the second gate G2 is the bottom gate. In another embodiment, the first gate G1 of the first transistor T1 is the bottom gate, and the second gate G2 is the top gate.

The second gate G2 receives a bias voltage provided for the first transistor T1. Through the compensation by the bias voltage at the second gate G2, the threshold voltage of the first transistor T1 is adjusted back to an initial state or a state close to the initial state, such that the subthreshold region A1 of the first transistor T1 is stable during different working stages of the sensing circuit 01. In this case, the first transistor T1 can maintain a stable and relatively high signal amplification capability. In other words, the sensing circuit 01 has a stable and relatively high signal amplification capability.

As shown in FIG. 2, in order to implement the bias voltage compensation for the first transistor T1 by the second gate G2, the sensing circuit 01 further includes a bias compensation circuit 12. The bias compensation module 12 is electrically connected to the first transistor T1 and configured to supply the bias voltage into the second gate G2 of the first transistor T1.

In addition, as shown in FIG. 2, the sensing circuit 01 further includes a first capacitor Cst1. The first capacitor Cst1 includes a first plate electrically connected to the second gate G2 of the first transistor T1, and a second plate electrically connected to a first fixed potential signal terminal P1. The first capacitor Cst1 is used to maintain a potential of the second gate G2 of the first transistor T1.

At least one working cycle of the sensing circuit 01 provided in this embodiment of the present disclosure includes a bias compensation stage, an integration stage, and a read stage.

At the bias compensation stage, the bias compensation circuit 12 is turned on and the bias voltage is inputted into the second gate G2 of the first transistor T1.

At the integration stage, a potential of the second gate G2 remains stable, such that the threshold voltage of the first transistor T1 is adjusted back to the initial state. In addition, at the integration stage, the first gate G1 of the first transistor T1 receives the sensing signal outputted by the sensor 02.

At the read stage, the read circuit 11 is turned on, such that an output terminal of the first transistor T1 is electrically connected to the output terminal OUT of the sensing circuit 01. In this way, the detection current generated by the first transistor T1 is outputted through the output terminal OUT of the sensing circuit 01.

It should be noted that, at the beginning of power-on of the sensing circuit 01, the read circuit 11 can be turned on and the detection current outputted by the sensing circuit 01 is used as a reference current. The detection current outputted by the sensing circuit 01 at the read stage in a subsequent working cycle of the sensing circuit 01 is compared with the reference current to determine a change in measured information received by the sensor 02. Certainly, the reference current may be selected flexibly and is not limited to the detection current outputted by the sensing circuit 01 at the beginning of the power-on of the sensing circuit 01.

In the sensing circuit 01 provided in this embodiment of the present disclosure, the first transistor T1 is configured to convert and amplify the sensing signal outputted by the sensor 02, the first gate G1 receives the sensing signal, and the second gate G2 receives the bias voltage. The bias voltage received by the second gate G2 can adjust the threshold voltage of the first transistor T1 back to the initial threshold voltage, making the subthreshold region of the first transistor T1 relatively stable. In this case, during the detection process of the sensor 02, the first transistor T1 always maintains in the subthreshold region with excellent signal conversion and amplification capabilities. Therefore, the sensing circuit 01 can maintain a highly sensitive detection state.

Figure 5:
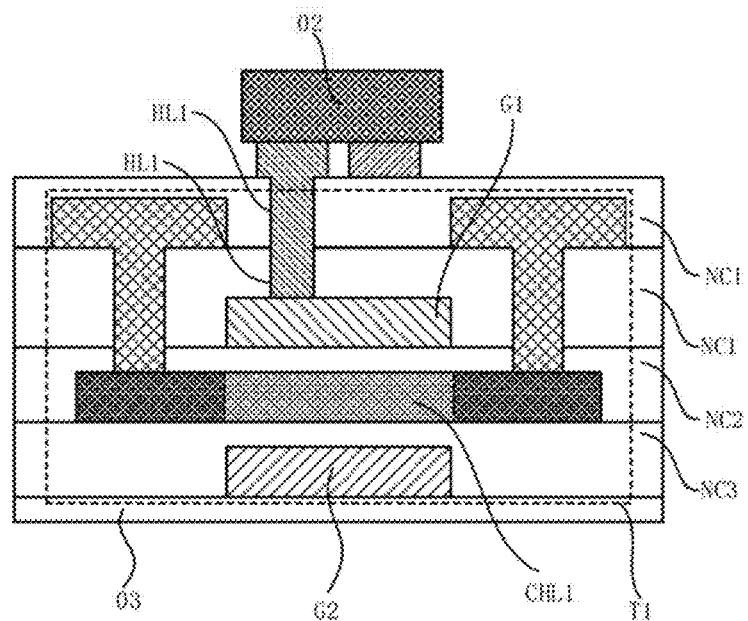
FIG. 5 is a schematic structural diagram of a first transistor in a sensing circuit according to an embodiment of the present disclosure.
Figure 6:
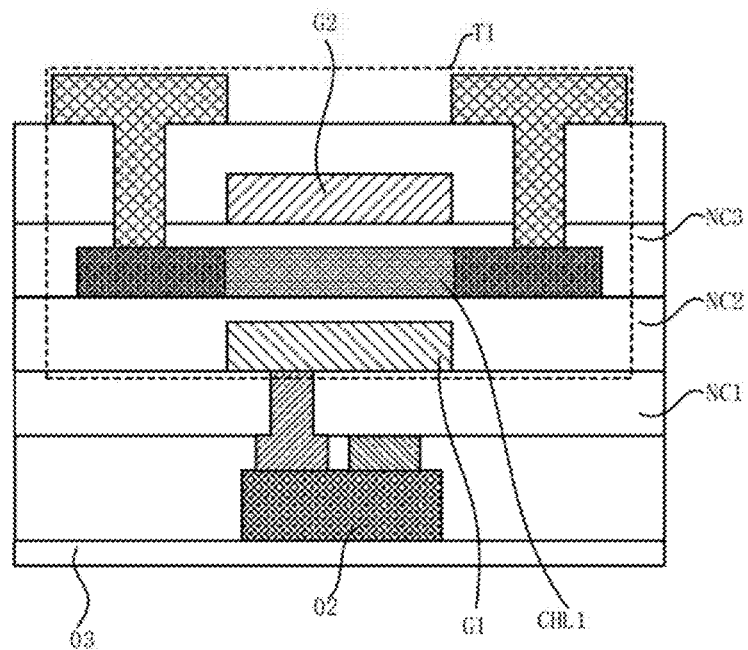
FIG. 6 is a schematic structural diagram of a first transistor in a sensing circuit according to an embodiment of the present disclosure.

FIG. 5 is a schematic structural diagram of a first transistor in a sensing circuit according to an embodiment of the present disclosure. FIG. 6 is a schematic structural diagram of a first transistor in a sensing circuit according to an embodiment of the present disclosure.

In an embodiment of the present disclosure, one side of the first gate G1 away from the channel region CHL1 of the first transistor T1 is provided with a first insulating layer NC1, and the first insulating layer NC1 is provided with a via hole HL1. The first gate G1 receives, through a conductive structure provided in the first via hole HL1, the sensing signal output by the sensor 02. That is, the first gate G1 and the sensor 02 electrically connected thereto are provided in different layers, and the first gate G1 and the sensor 02 are electrically connected to each other through the via hole HL1 provided in the first insulating layer NC1.

In an embodiment, as shown in FIG. 5, the first gate G1 may be provided at one side of the channel region CHL1 of the first transistor T1 away from a substrate 03, and the first insulating layer NC1 may be provided at one side the first transistor T1 away from the substrate 03. The sensor 02 may also be provided at the side of the first transistor T1 away from the substrate 03. In this embodiment, the first gate G1 may be the top gate of the first transistor T1, and the second gate G2 may be the bottom gate of the first transistor T1.

In another embodiment, as shown in FIG. 6, the first gate G1 may be provided at one side of the channel region CHL1 of the first transistor T1 adjacent to the substrate 03, and the first insulating layer NC1 may be provided at one side of the first transistor T1 adjacent to the substrate 03. The sensor 02 may also be provided at the side of the first transistor T1 adjacent to the substrate 03. In this embodiment, the first gate G1 may be the bottom gate of the first transistor T1, and the second gate G2 may be the top gate of the first transistor T1.

In an embodiment of the present disclosure, a capacitance value per unit area between the first gate G1 and the channel region CHL1 of the first transistor T1 is C1, and a capacitance value per unit area between the second gate G2 and the channel region CHL1 of the first transistor T1 is C2, where C1 and C2 satisfy $C1/C2 \geq 1$. That is, a capacitance per unit area between the first gate G1 of the first transistor T1 and the channel region CHL1 is not less than a capacitance per unit area between the second gate G2 and the channel region CHL1. In other words, a capacitance value per unit area of a capacitance formed between the first gate G1 and the channel region CHL1 of the first transistor T1 is greater than a capacitance value per unit area of a capacitance formed between the second gate G2 and the channel region CHL1 of the first transistor T1.

When $C1/C2>1$, a vertical swing in the transfer characteristic curve of the first transistor T1 is increased. In addition, a larger ratio between C1 and C2 indicates a larger vertical swing in the transfer characteristic curve of the first transistor T1, a stronger signal amplification capability of the first transistor T1, and higher detection sensitivity of the sensing circuit 01.

When $C1/C2=1$, although the vertical swing in the transfer characteristic curve of the first transistor T1 is not increased, the compensation effect to the threshold voltage drift of the first transistor T1 through the bias voltage received by the second gate G2 is still achieved.

As shown in FIG. 5 and FIG. 6, the first transistor T1 further includes a second insulating layer NC2 sandwiched between the first gate G1 and the channel region CHL1, and a third insulating layer NC3 sandwiched between the second gate G2 and the channel region CHL1.

In an embodiment, a dielectric constant of the second insulating layer NC2 is greater than a dielectric constant of the third insulating layer NC3. By setting the dielectric constant of the insulating layer between the first gate G1 and the channel region CHL1 to be greater than the dielectric constant of the insulating layer between the second gate G2 and the channel region CHL1, C1 and C2 satisfy: $C1/C2 \geq 1$.

The second insulating layer NC2 may be made of at least one material such as metal oxide (for example, aluminum oxide or hafnium dioxide) or an organic material (for example, polyvinylidene fluoride). The first insulating layer NC1 may be made of at least one material such as silicon nitride or silicon oxide.

Figure 7:
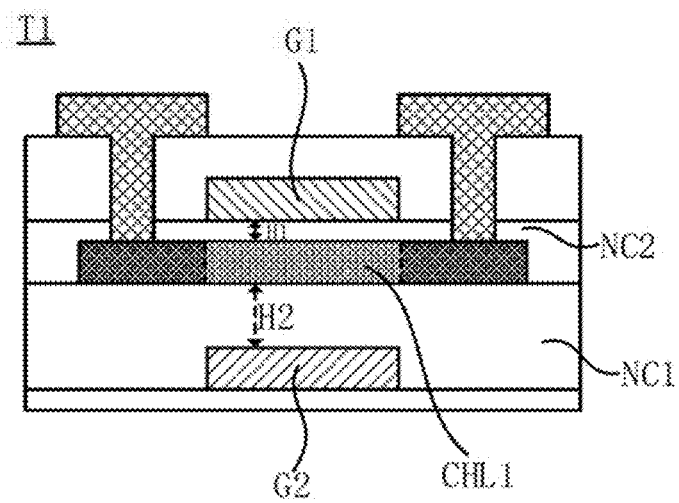
FIG. 7 is a schematic structural diagram of a first transistor in a sensing circuit according to an embodiment of the present disclosure.
Figure 8:
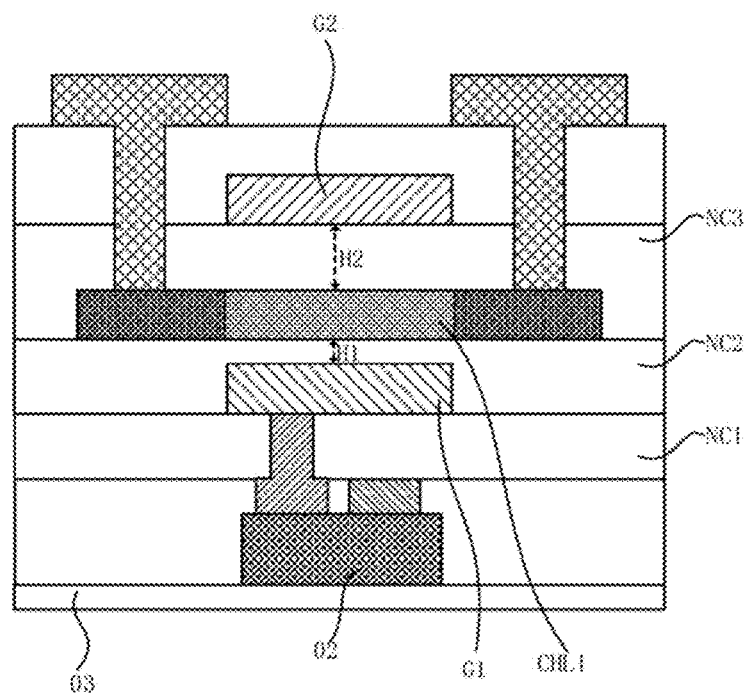
FIG. 8 is a schematic structural diagram of a first transistor in a sensing circuit according to an embodiment of the present disclosure.

FIG. 7 is a schematic structural diagram of a first transistor in a sensing circuit according to an embodiment of the present disclosure. FIG. 8 is a schematic structural diagram of a first transistor in a sensing circuit according to an embodiment of the present disclosure.

In an embodiment, as shown in FIG. 7 and FIG. 8, a distance H1 between the first gate G1 and the channel region CHL1 of the first transistor T1 is less than a distance H2 between the second gate G2 and the channel region CHL1 of the first transistor T1. Such arrangement can be implemented by setting a thickness of the second insulating layer NC2 to be less than a thickness of the third insulating layer NC3. Setting the distance H1 between the first gate G1 and the channel region CHL1 to be less than the distance H2 between the second gate G2 and the channel region CHL1 enables C1 and C2 to satisfy: $C1/C2 \geq 1$.

In an embodiment, a dielectric constant of the second insulating layer NC2 is greater than a dielectric constant of the third insulating layer NC3, and a distance H1 between the first gate G1 and the channel region CHL1 of the first transistor T1 is less than a distance H2 between the second gate G2 and the channel region CHL1 of the first transistor T1.

Figure 9:
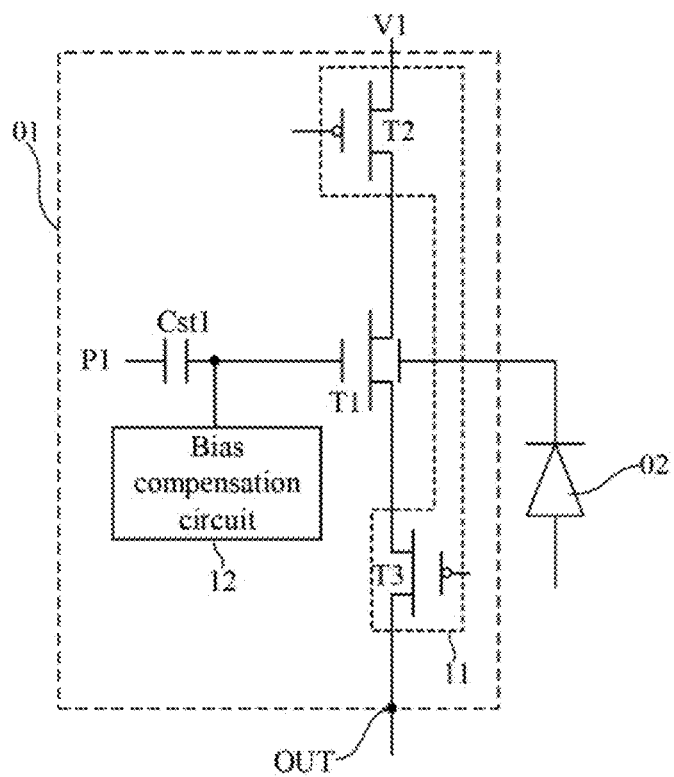
FIG. 9 is a schematic diagram of a sensing circuit according to an embodiment of the present disclosure.
Figure 10:
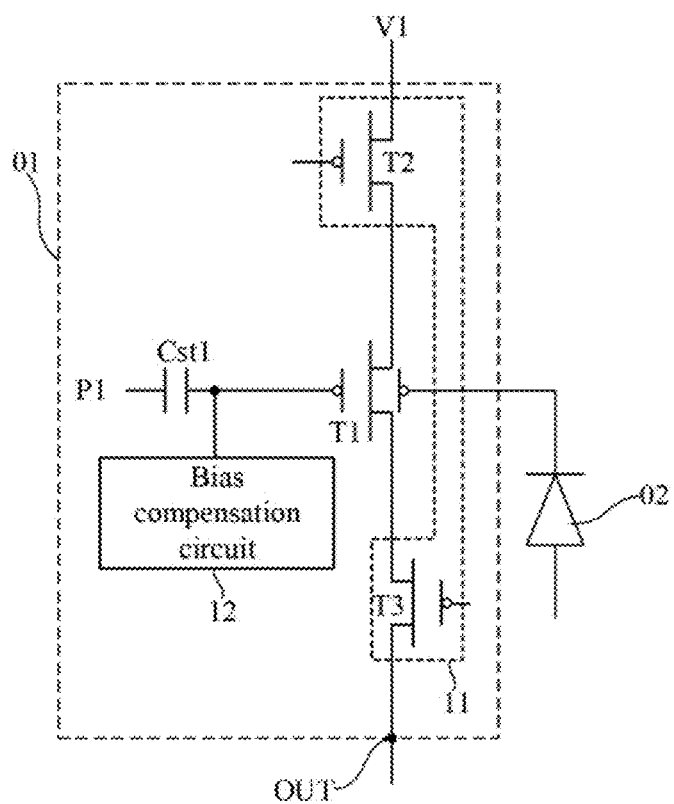
FIG. 10 is a schematic diagram of a sensing circuit according to an embodiment of the present disclosure.

FIG. 9 is a schematic diagram of a sensing circuit according to an embodiment of the present disclosure. FIG. 10 is a schematic diagram of a sensing circuit according to an embodiment of the present disclosure.

In an embodiment, as shown in FIG. 9 and FIG. 10, the read circuit 11 includes a second transistor T2 and a third transistor T3. An input terminal of the second transistor T2 receives a first voltage V1, and an output terminal of the second transistor T2 is electrically connected to an input terminal (that is, a first electrode E1) of the first transistor T1. An input terminal of the third transistor T3 is electrically connected to an output terminal (that is, a second electrode E2) of the first transistor T1, and an output terminal of the third transistor T3 is electrically connected to the output terminal OUT of the sensing circuit 01.

At the read stage of the sensing circuit 01, the read circuit 11 is turned on, that is, both the second transistor T2 and the third transistor T3 are turned on. In this case, the input terminal (that is, the first electrode E1) of the first transistor T1 receives the first voltage V1, and a voltage difference between the input terminal and the gate of the first transistor T1 makes the first transistor T1 turned on or not turned on. When the first transistor T1 is turned on, the first transistor T1 generates a detection current, and the magnitude of the detection current depends on the magnitude of the sensing signal generated by the sensor 02. When the first transistor T1 is not turned on, it means that the sensor 02 does not generate any sensing signal or the magnitude of the generated sensing signal cannot be detected by the sensing circuit 01.

In an embodiment, as shown in FIG. 9, the first transistor T1 may be an N-channel transistor, and a potential level of the first voltage V1 is less than a potential level of the output terminal OUT of the sensing circuit 01, so as to ensure that the first transistor T1 can generate a detection current when the second transistor T2 and the third transistor T3 are turned on.

The semiconductor layer SC of the first transistor T1 may be a metal oxide semiconductor layer. When the first transistor T1 includes a metal oxide semiconductor layer, the subthreshold swing of the first transistor T1 may be set smaller to increase the detection sensitivity of the sensing circuit.

In an embodiment, as shown in FIG. 10, the first transistor T1 may be a P-channel transistor, and a potential level of the first voltage V1 is greater than a potential level of the output terminal OUT of the sensing circuit 01, so as to ensure that the first transistor T1 can generate a detection current when the second transistor T2 and the third transistor T3 are turned on.

In this embodiment, the input terminal of the second transistor T2 may be electrically connected to the first fixed potential signal terminal P1. In this case, the first voltage V1 that is received by the input terminal of the second transistor T2 and outputted to the input terminal of the first transistor T1 may be the constant potential level of the first fixed potential signal terminal P1.

Figure 11:
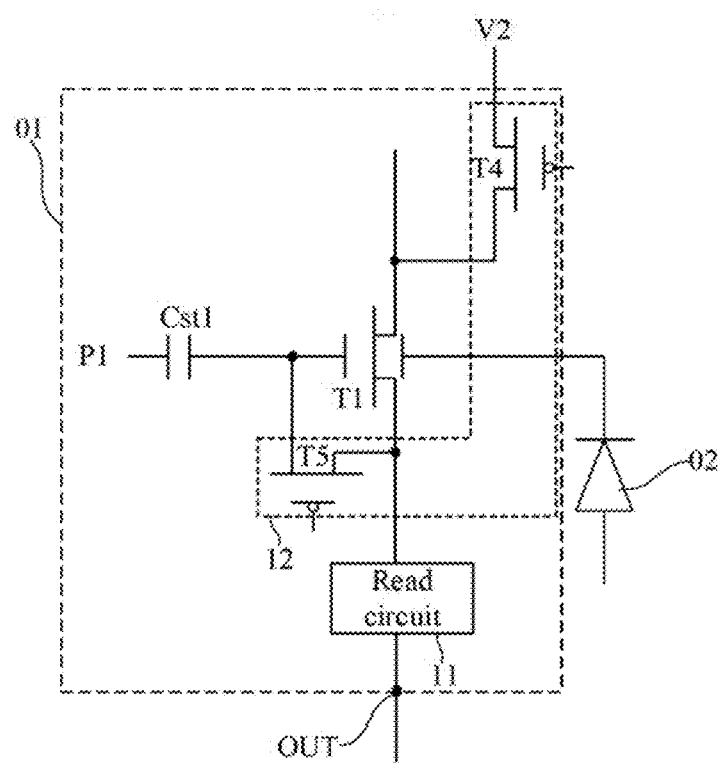
FIG. 11 is a schematic diagram of a sensing circuit according to an embodiment of the present disclosure.
Figure 12:
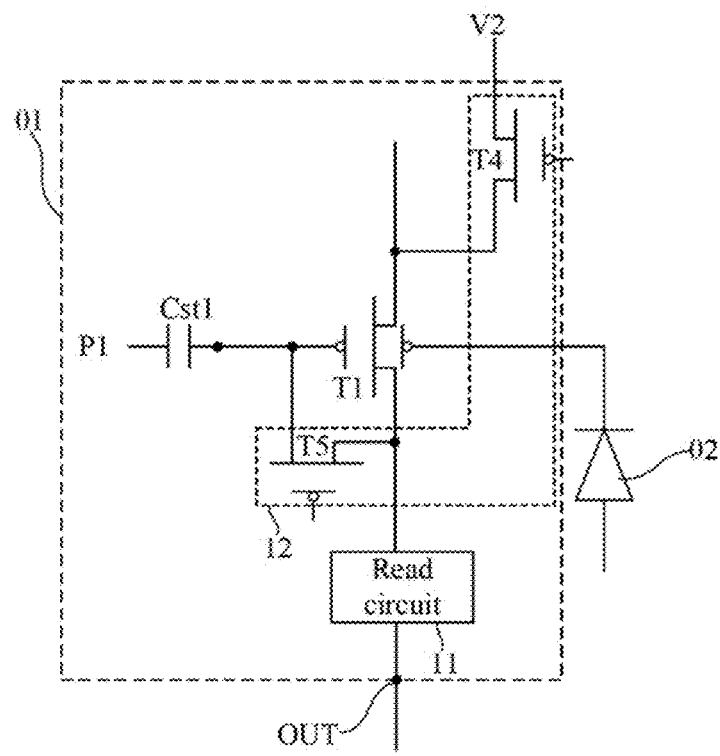
FIG. 12 is a schematic diagram of a sensing circuit according to an embodiment of the present disclosure.

FIG. 11 is a schematic diagram of a sensing circuit according to an embodiment of the present disclosure. FIG. 12 is a schematic diagram of a sensing circuit according to an embodiment of the present disclosure.

In an embodiment of the present disclosure, as shown in FIG. 11 and FIG. 12, the bias compensation circuit 12 includes a fourth transistor T4 and a fifth transistor T5. An input terminal of the fourth transistor T4 is used for receiving a second voltage V2, and an output terminal of the fourth transistor T4 is electrically connected to an input terminal (that is, a first electrode E1) of the first transistor T1. An input terminal of the fifth transistor T5 is electrically connected to an output terminal (that is, a second electrode E2) of the first transistor T1, and an output terminal of the fifth transistor T5 is electrically connected to the second gate G2 of the first transistor T1.

At a bias compensation stage of the sensing circuit 01, the bias compensation circuit 12 is turned on, that is, the fourth transistor T4 and the fifth transistor T5 are turned on. In this case, the second voltage V2 is transmitted to the second gate G2 of the first transistor T1 through the fourth transistor T4, the first transistor T1, and the fifth transistor T5. In this case, the bias voltage is inputted into the second gate G2.

It should be noted that, in the process of inputting the second voltage V2 into the second gate G2 of the first transistor T1, due to a voltage drop and limitations of threshold voltages of the fourth transistor T4 and the fifth transistor T5, the bias voltage received by the second gate G2 of the first transistor T1 at the bias compensation stage is slightly different from the second voltage V2. In a case of ignoring impact of the voltage drop and the threshold voltages, the bias voltage is the second voltage V2.

It should be further noted that, the bias voltage may be determined according to an actual situation, that is, the bias voltage may vary depending on actual application statuses. For example, a bias voltage used when the sensing circuit is in a first environment for a long time is different from a bias voltage used when the sensing circuit is in a second environment for a long time. A signal to be detected in the first environment and a signal to be detected in the second environment are significantly different in strength.

Figure 13:
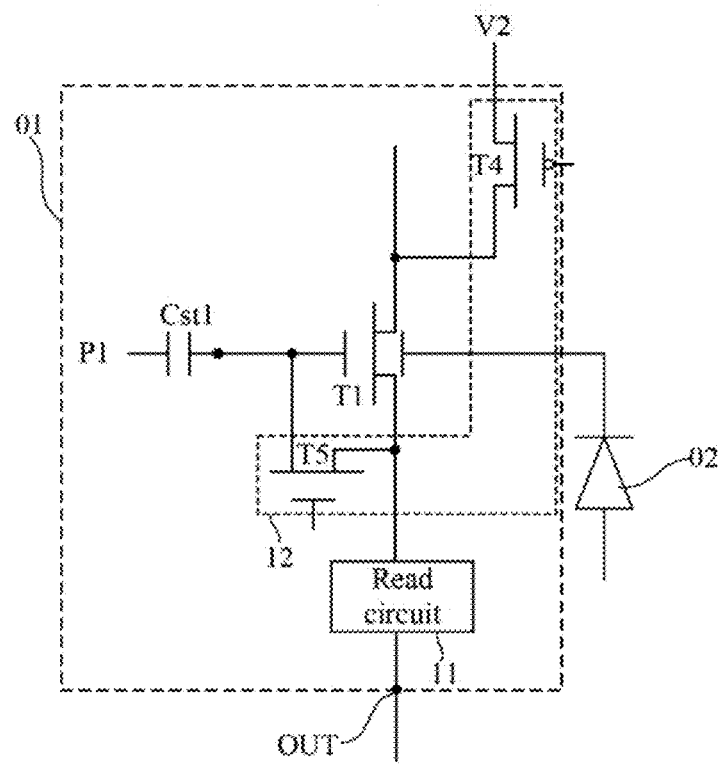
FIG. 13 is a schematic diagram of a sensing circuit according to an embodiment of the present disclosure.
Figure 14:
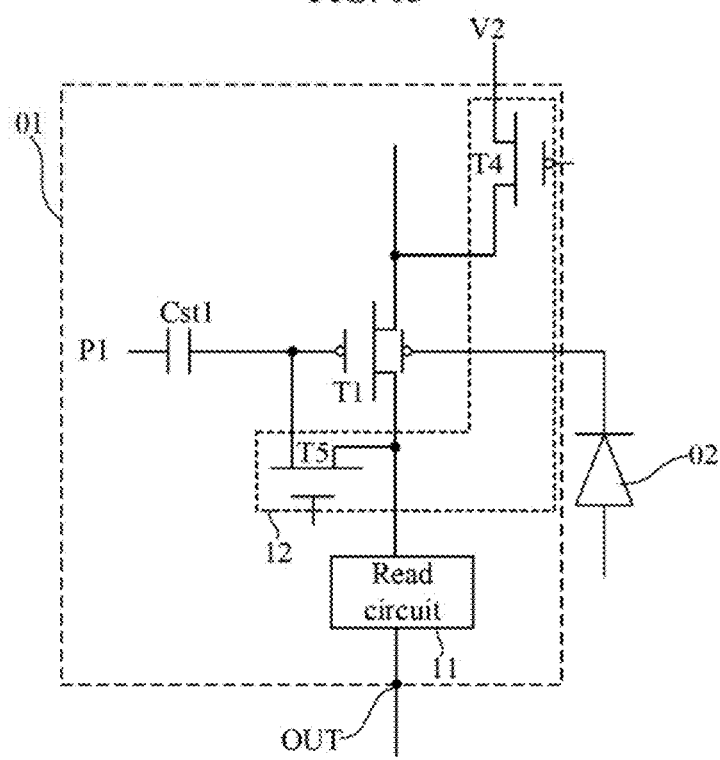
FIG. 14 is a schematic diagram of a sensing circuit according to an embodiment of the present disclosure.

FIG. 13 is a schematic diagram of a sensing circuit according to an embodiment of the present disclosure. FIG. 14 is a schematic diagram of a sensing circuit according to an embodiment of the present disclosure.

In an embodiment, as shown in FIG. 11 and FIG. 12, the fifth transistor T5 may be a P-channel transistor.

In an embodiment, as shown in FIG. 13 and FIG. 14, the fifth transistor T5 may be an N-channel transistor. In this case, the risk that a potential of the second gate G2 of the first transistor T1 is reduced due to leakage current through the sixth transistor T5 is reduced.

Further, a semiconductor layer of the fifth transistor T5 may be a metal oxide semiconductor layer.

In an embodiment, as shown in FIG. 13, both the first transistor T1 and the fifth transistor T5 are N-channel transistors. Further, both semiconductor layers of the first transistor T1 and the fifth transistor T5 may be metal oxide semiconductor layers.

Figure 15:
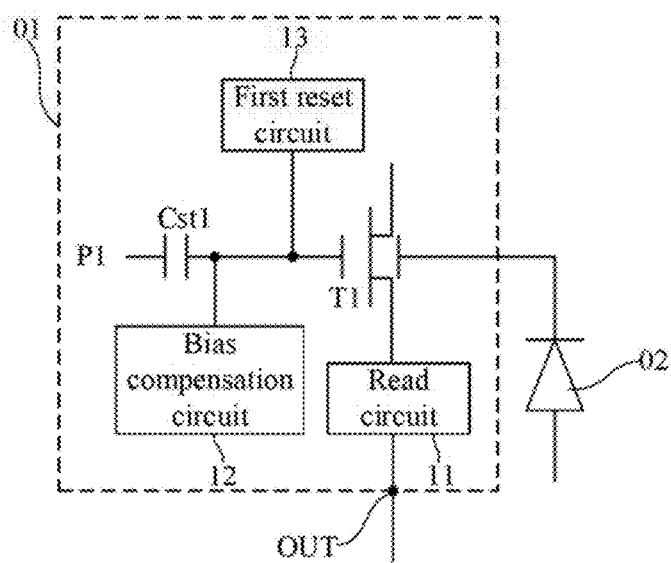
FIG. 15 is a schematic diagram of a sensing circuit according to an embodiment of the present disclosure.
Figure 16:
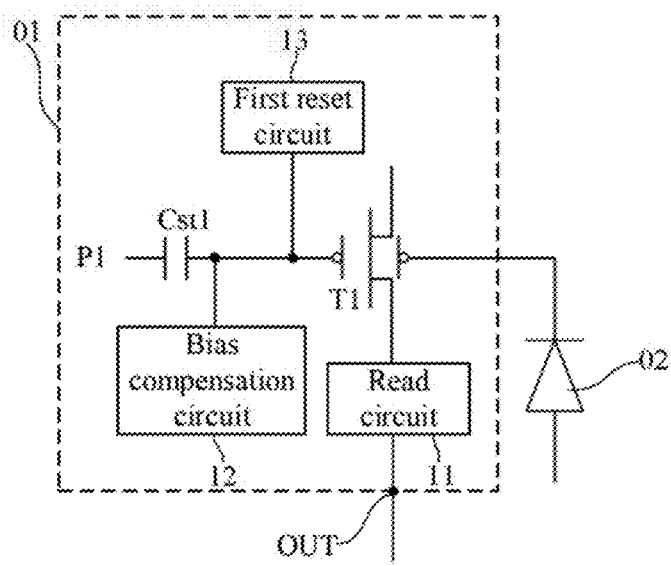
FIG. 16 is a schematic diagram of a sensing circuit according to an embodiment of the present disclosure.

FIG. 15 is a schematic diagram of a sensing circuit according to an embodiment of the present disclosure. FIG. 16 is a schematic diagram of a sensing circuit according to an embodiment of the present disclosure.

In an embodiment of the present disclosure, as shown in FIG. 15 and FIG. 16, the sensing circuit 01 provided in this embodiment of the present disclosure further includes a first reset circuit 13. The first reset circuit 13 is electrically connected to the second gate G2 of the first transistor T1 and configured to reset the second gate G2 of the first transistor T1.

The first reset circuit 13 is provided for resetting the second gate G2 of the first transistor T1 for the following reason. When the bias voltage needs to be inputted into the second gate G2 of the first transistor T1 through the turned-on first transistor T1, the second gate G2 of the first transistor T1 is reset before the bias compensation stage, such that the second gate G2 of the first transistor T1 is reset to an initial potential. In addition, the second gate G2 of the first transistor T1 is reset to ensure that the first transistor T1 can maintain an on state during the bias compensation stage.

In a previous working cycle of the working cycle to which the bias compensation stage belongs, the sensing signal outputted by the sensor 02 may cause the first transistor T1 to shift from the subthreshold region to the on state, but may also cause the first transistor T1 to shift from the subthreshold region to an off state. When the sensing signal outputted by the sensor 02 causes the first transistor to shift from the subthreshold region to the off state, since the sensing signal in the previous working cycle cause the first transistor T1 to maintain the on state, it is difficult to input the bias voltage to the second gate G2 of the first transistor T1. Therefore, the first reset circuit 13 is provided to input the bias voltage to the second gate G2 of the first transistor T1 at the bias compensation stage.

Before the bias compensation stage, a reset stage may be performed. At this time, the first reset circuit 13 is turned on to reset the second gate G2 of the first transistor T1. A reason for resetting the second gate G2 of the first transistor T1 is to maintain the second gate G2 of the first transistor T1 at a preset potential before the bias compensation stage, such that the bias compensation circuit 12 can compensate for the second gate G2 of the first transistor T1 more accurately. Otherwise, the bias voltage plus a non-preset voltage of the second gate G2 of the first transistor T1 may lead to inaccurate bias compensation, or even cause a problem of overcompensation.

Figure 17:
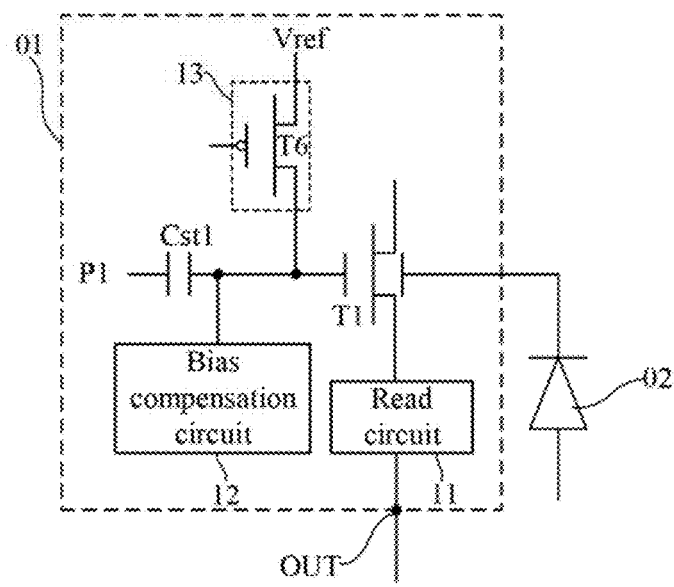
FIG. 17 is a schematic diagram of a sensing circuit according to an embodiment of the present disclosure.
Figure 18:
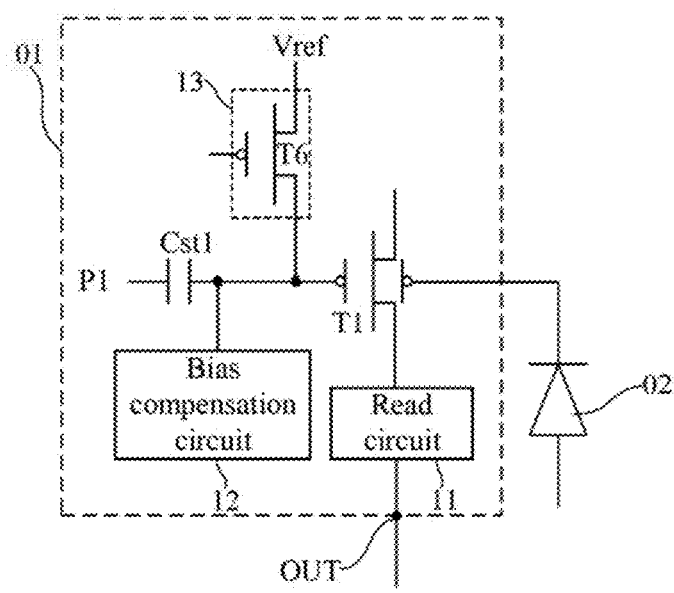
FIG. 18 is a schematic diagram of a sensing circuit according to an embodiment of the present disclosure.

FIG. 17 is a schematic diagram of a sensing circuit according to an embodiment of the present disclosure. FIG. 18 is a schematic diagram of a sensing circuit according to an embodiment of the present disclosure.

In an embodiment, as shown in FIG. 17 and FIG. 18, the first reset circuit 13 includes a sixth transistor T6. An input terminal of the sixth transistor T6 is used to receive a reset voltage $V_{ref}$, and an output terminal of the sixth transistor T6 is electrically connected to the second gate G2 of the first transistor T1.

In this embodiment, at the reset stage, the sixth transistor T6 is turned on, and the reset voltage $V_{ref}$ is inputted to the second gate G2 of the first transistor T1.

Figure 19:
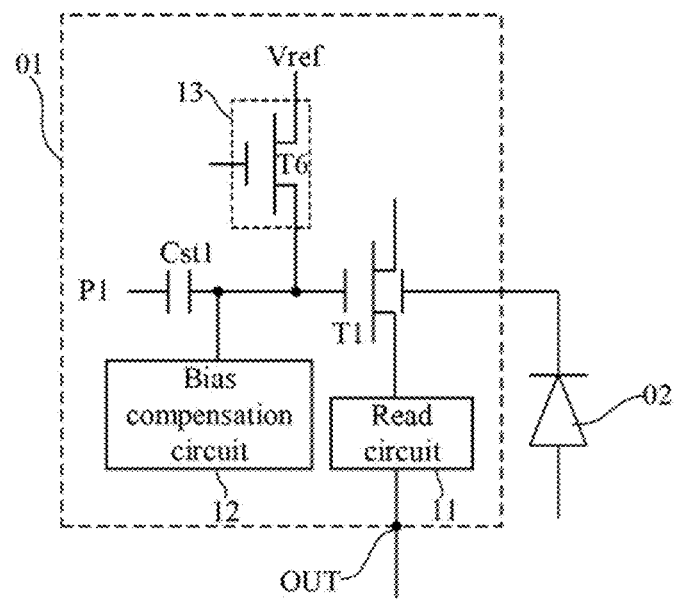
FIG. 19 is a schematic diagram of a sensing circuit according to an embodiment of the present disclosure.
Figure 20:
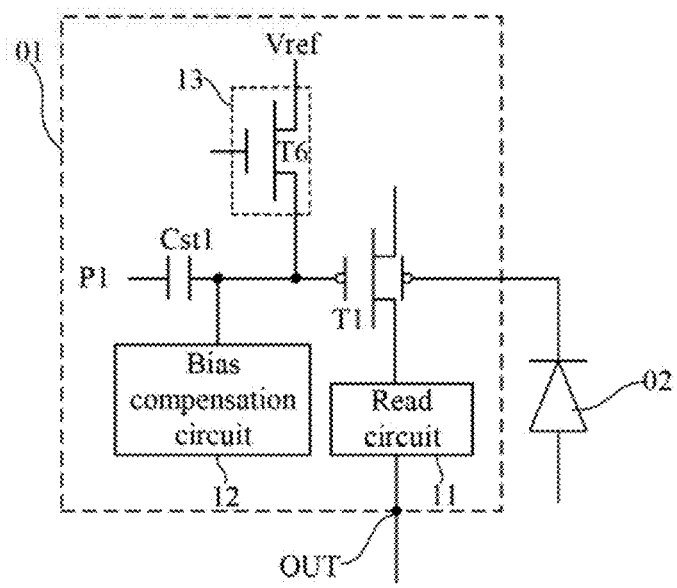
FIG. 20 is a schematic diagram of a sensing circuit according to an embodiment of the present disclosure.

FIG. 19 is a schematic diagram of a sensing circuit according to an embodiment of the present disclosure. FIG. 20 is a schematic diagram of a sensing circuit according to an embodiment of the present disclosure.

In an embodiment, as shown in FIG. 17 and FIG. 18, the sixth transistor T6 may be a P-channel transistor.

In an embodiment, as shown in FIG. 19 and FIG. 20, the sixth transistor T6 may be an N-channel transistor. In this case, a risk that the potential of the second gate G2 of the first transistor T1 is reduced due to a leakage current through the sixth transistor T6 is reduced.

Further, a semiconductor layer of the sixth transistor T6 may be a metal oxide semiconductor layer.

In an embodiment, as shown in FIG. 19, both the first transistor T1 and the sixth transistor T6 are N-channel transistors. Further, both semiconductor layers of the first transistor T1 and the sixth transistor T6 may be metal oxide semiconductor layers.

As shown in FIG. 16, FIG. 18, and FIG. 20, the first transistor T1 is a P-channel transistor, and a potential level of the second voltage V2 is greater than a potential level of the reset voltage $V_{ref}$. In this case, when the first transistor T1 is a P-channel transistor, a potential level of a reset voltage received by the second gate G2 of the first transistor T1 at the reset stage is less than a potential level of a bias voltage received by the second gate G2 of the first transistor T1 at the bias compensation stage.

As shown in FIG. 15, FIG. 17, and FIG. 19, the first transistor T1 is an N-channel transistor, and a potential level of the second voltage V2 is less than a potential level of the reset voltage $V_{ref}$. In this case, when the first transistor T1 is an N-channel transistor, a potential level of a reset voltage received by the second gate G2 of the first transistor T1 at the reset stage is greater than that of a bias voltage received by the second gate G2 of the first transistor T1 at the bias compensation stage.

In an embodiment, the sensing circuit includes the first transistor T1, the fifth transistor T5, and the sixth transistor T6, a semiconductor layer of at least one of the first transistor T1, the fifth transistor T5, or the sixth transistor T6 is a metal oxide semiconductor layer.

Figure 21:
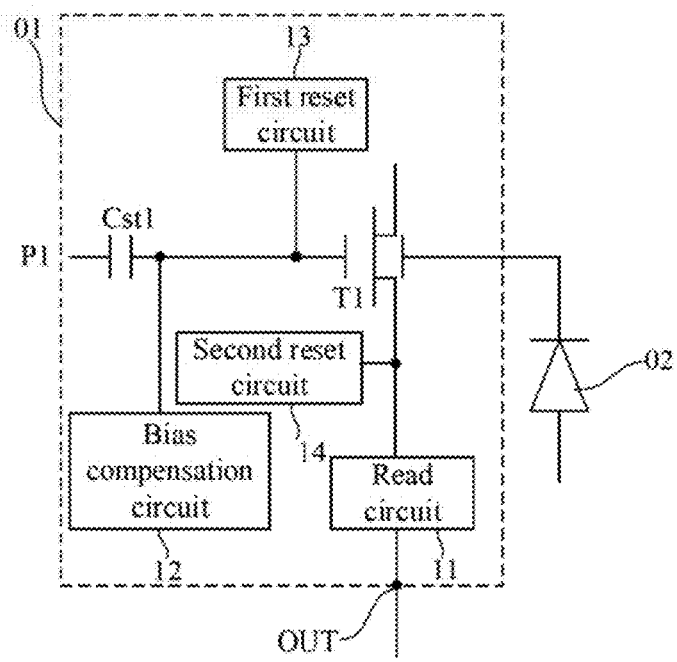
FIG. 21 is a schematic diagram of a sensing circuit according to an embodiment of the present disclosure.
Figure 22:
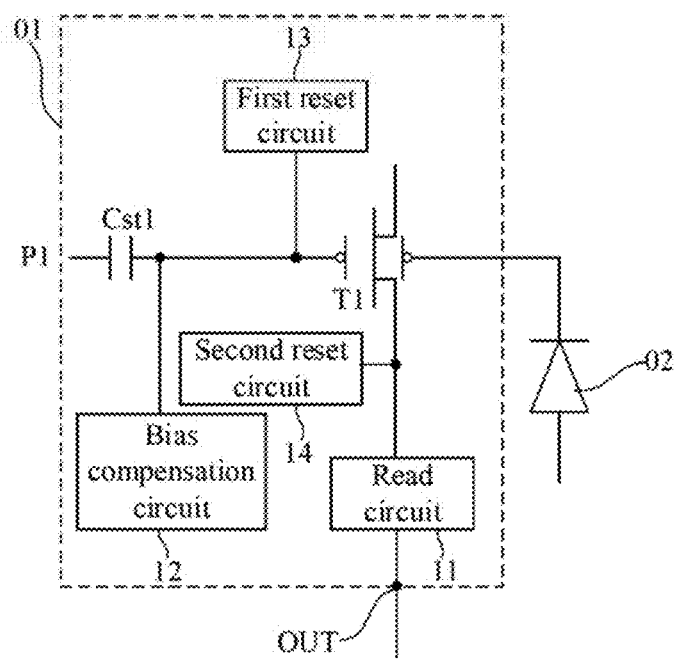
FIG. 22 is a schematic diagram of a sensing circuit according to an embodiment of the present disclosure.

FIG. 21 is a schematic diagram of a sensing circuit according to an embodiment of the present disclosure. FIG. 22 is a schematic diagram of a sensing circuit according to an embodiment of the present disclosure.

In an embodiment of the present disclosure, as shown in FIG. 21 and FIG. 22, the sensing circuit further includes a second reset circuit 14. The second reset circuit 14 is electrically connected to the output terminal of the first transistor T1 and configured to reset the output terminal of the first transistor T1.

At the reset stage, the second reset circuit 14 and the first reset circuit 13 may be turned on at the same time, and simultaneously reset the second gate G2 of the first transistor T1 and the output terminal of the first transistor T1.

Figure 23:
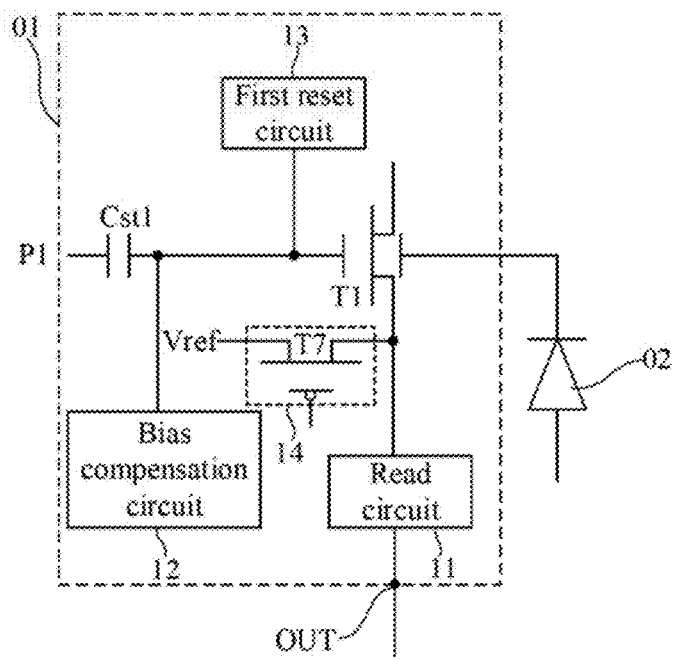
FIG. 23 is a schematic diagram of a sensing circuit according to an embodiment of the present disclosure.
Figure 24:
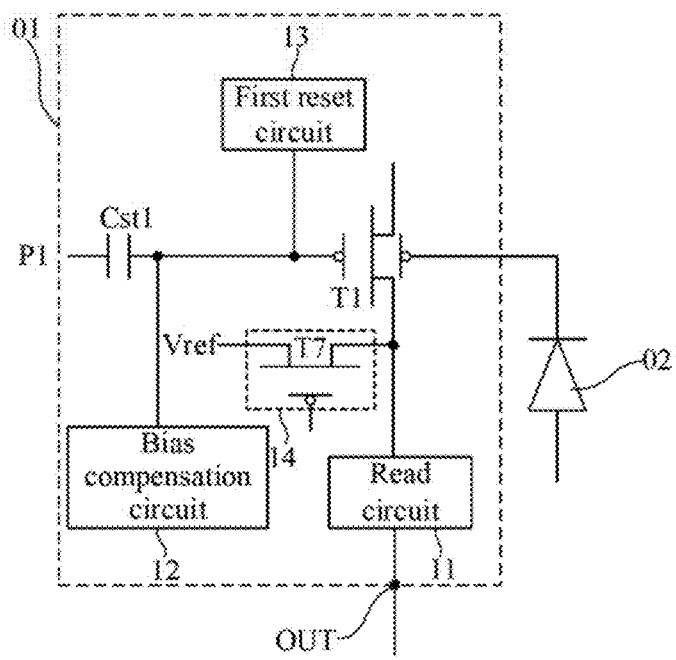
FIG. 24 is a schematic diagram of a sensing circuit according to an embodiment of the present disclosure.
Figure 25:
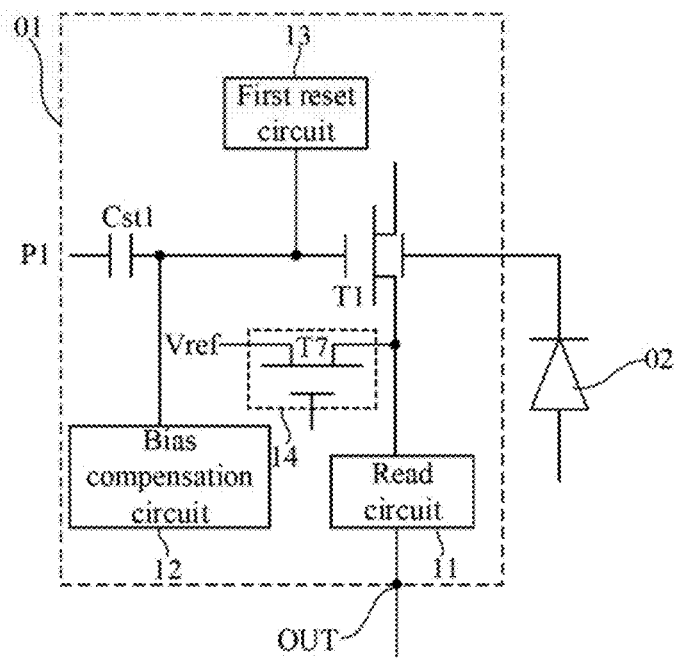
FIG. 25 is a schematic diagram of a sensing circuit according to an embodiment of the present disclosure.
Figure 26:
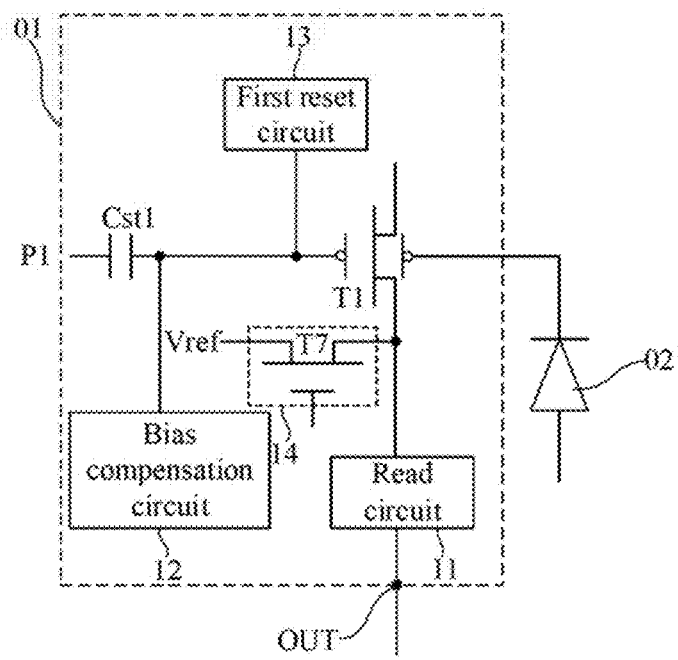
FIG. 26 is a schematic diagram of a sensing circuit according to an embodiment of the present disclosure.

FIG. 23 is a schematic diagram of a sensing circuit according to an embodiment of the present disclosure. FIG. 24 is a schematic diagram of a sensing circuit according to an embodiment of the present disclosure. FIG. 25 is a schematic diagram of a sensing circuit according to an embodiment of the present disclosure. FIG. 26 is a schematic diagram of a sensing circuit according to an embodiment of the present disclosure.

In an embodiment, as shown in FIG. 23 to FIG. 26, the second reset circuit 14 includes a seventh transistor T7. An input terminal of the seventh transistor T7 receives a reset voltage $V_{ref}$, and an output terminal of the seventh transistor T7 is electrically connected to the output terminal of the first transistor T1.

In an embodiment, as shown in FIG. 23 and FIG. 24, the seventh transistor T7 is a P-channel transistor.

In an embodiment, as shown in FIG. 25 and FIG. 26, the seventh transistor T7 is an N-channel transistor.

In this embodiment, in the same sensing circuit 01, the input terminal of the sixth transistor T6 and the input terminal of the seventh transistor T7 may be electrically connected to each other and both receive the reset voltage $V_{ref}$.

In addition, in the same sensing circuit 01, the input terminal of the sixth transistor T6 and the input terminal of the seventh transistor T7 may be electrically connected to different signal lines which both transmit the reset voltage $V_{ref}$.

Figure 27:
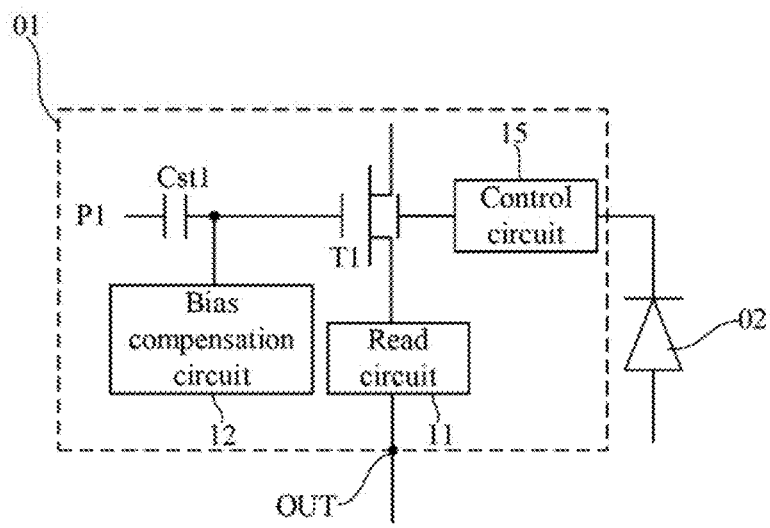
FIG. 27 is a schematic diagram of a sensing circuit according to an embodiment of the present disclosure.
Figure 28:
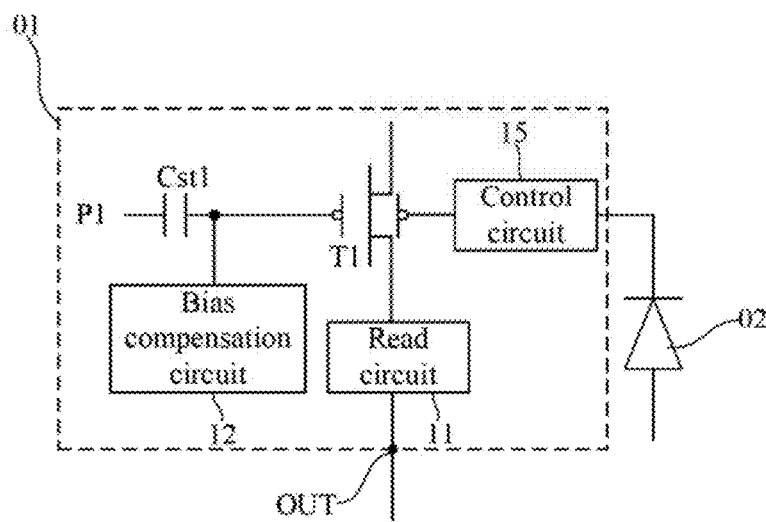
FIG. 28 is a schematic diagram of a sensing circuit according to an embodiment of the present disclosure.

FIG. 27 is a schematic diagram of a sensing circuit according to an embodiment of the present disclosure. FIG. 28 is a schematic diagram of a sensing circuit according to an embodiment of the present disclosure.

In an embodiment, as shown in FIG. 27 and FIG. 28, the sensing circuit 01 further includes a control circuit 15. An input terminal of the control circuit 15 receives the sensing signal outputted by the sensor 02, and an output terminal of the control circuit 15 is electrically connected to the first gate G1 of the first transistor T1. In this embodiment, the control circuit 15 is provided between the first gate G1 of the first transistor T1 and the output terminal of the sensor 02. The control circuit 15 is configured to control the connection between the first gate G1 of the first transistor T1 and the output terminal of the sensor 02.

At the integration stage t2, the control circuit 15 is turned on, and the sensing signal outputted by the sensor 02 is transmitted to the first gate G1 of the first transistor T1.

At other stages, the control circuit 15 may be turned off. For example, the control circuit 15 is turned off at a reset stage t0 to prevent the signal outputted by the sensor 02 from affecting a reset effect of the first gate G1 of the first transistor T1 and the output terminal of the first transistor T1. For example, the control circuit 15 is turned off at a bias compensation stage t1 to prevent the signal output by the sensor 02 from affecting a bias compensation effect of the first transistor T1. For example, the control circuit 15 is turned off at a read stage t3 to prevent the signal outputted by the sensor 02 from affecting a detection signal actually outputted by the sensing circuit 01.

Figure 29:
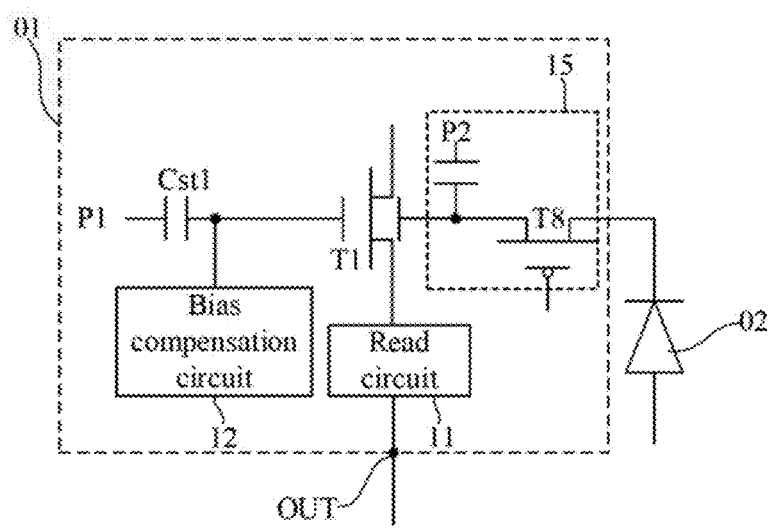
FIG. 29 is a schematic diagram of a sensing circuit according to an embodiment of the present disclosure.
Figure 30:
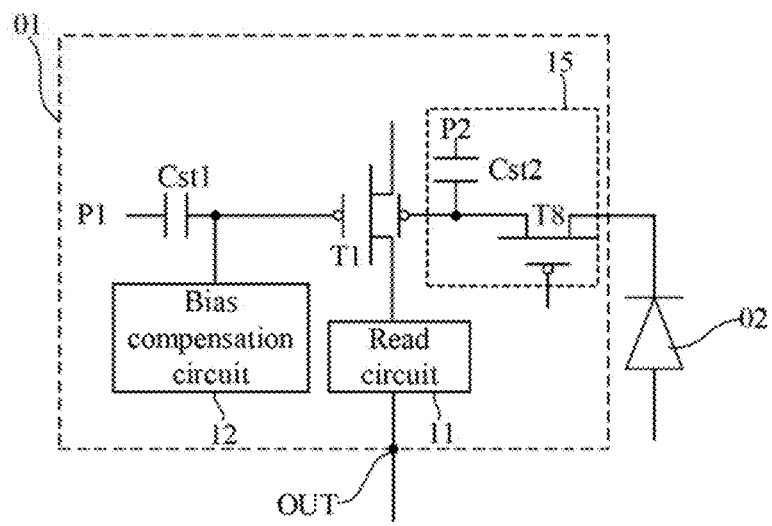
FIG. 30 is a schematic diagram of a sensing circuit according to an embodiment of the present disclosure.
Figure 31:
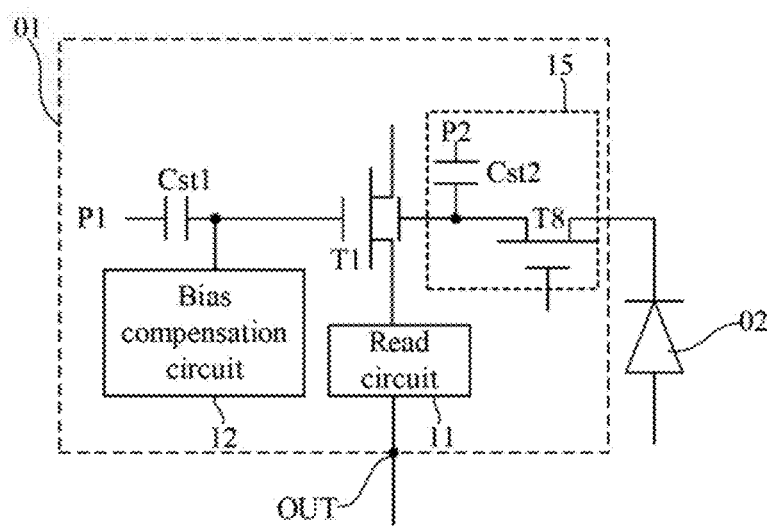
FIG. 31 is a schematic diagram of a sensing circuit according to an embodiment of the present disclosure.
Figure 32:
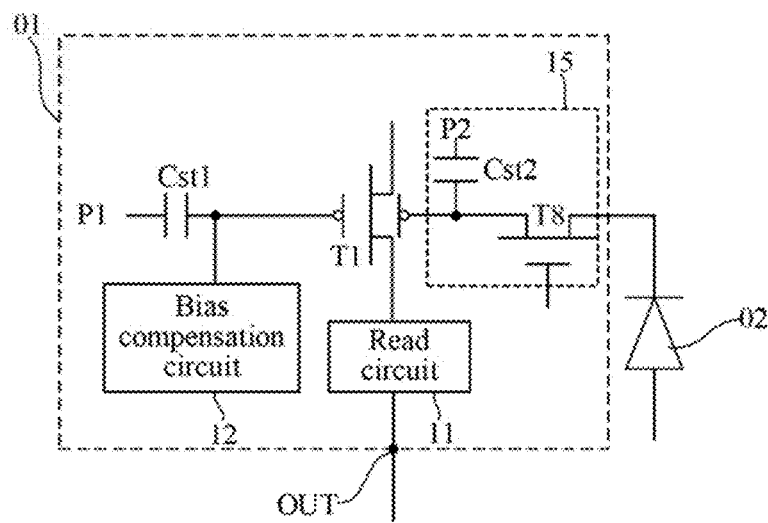
FIG. 32 is a schematic diagram of a sensing circuit according to an embodiment of the present disclosure.

FIG. 29 is a schematic diagram of a sensing circuit according to an embodiment of the present disclosure. FIG. 30 is a schematic diagram of a sensing circuit according to an embodiment of the present disclosure. FIG. 31 is a schematic diagram of a sensing circuit according to an embodiment of the present disclosure. FIG. 32 is a schematic diagram of a sensing circuit according to an embodiment of the present disclosure.

In an embodiment, as shown in FIG. 29 to FIG. 32, the control circuit 15 includes an eighth transistor T8 and a second capacitor Cst2. An input terminal of the eighth transistor T8 receives the sensing signal outputted by the sensor 02, and an output terminal of the eighth transistor T8 is electrically connected to the first gate G1 of the first transistor T1. The second capacitor Cst2 includes a first plate electrically connected to the output terminal of the eighth transistor T8, and a second plate electrically connected to a second fixed potential signal terminal P2. The second fixed potential signal terminal P2 may be grounded.

In an embodiment, as shown in FIG. 29 and FIG. 30, the eighth transistor T8 is a P-channel transistor.

In an embodiment, as shown in FIG. 31 and FIG. 32, the eighth transistor T8 is an N-channel transistor.

An embodiment of the present disclosure further provides a sensing method of the sensing circuit. The method is used to detect, through the sensing circuit 01 provided in any one of the above embodiments, a sensing signal outputted by a sensor 02. The sensing method includes a plurality of working cycles. The plurality of working cycles include at least one first working cycle F1. The first working cycle F1 includes a bias compensation stage t1, an integration stage t2 (also referred to as the first integration stage), and a read stage t3 (also referred to as the first read stage).

At the bias compensation stage t1, the bias compensation circuit 12 is turned on, and the second voltage V2 is inputted into the second gate G2 of the first transistor T1 through the turned-on bias compensation circuit 12, that is, the bias voltage is inputted into the second gate G2 of the first transistor T1.

At the integration stage t2, both the bias compensation circuit 12 and the read circuit 11 are turned off, and the first gate of the first transistor receives the sensing signal outputted by the sensor 02.

At the read stage t3, the read circuit 11 is turned on, and the output terminal of the first transistor T1 is electrically connected to the output terminal OUT of the sensing circuit 01. In this way, a detection current generated by the first transistor T1 is outputted to the output terminal OUT of the sensing circuit 01 through the turned-on read circuit 11 and is then read.

The following description is made with an example in which the read circuit 11 includes a second transistor T2 and a third transistor T3, and the bias compensation circuit 12 includes a fourth transistor T4 and a fifth transistor T5. The connection manners of the first transistor T1, the second transistor T2, the third transistor T3, the fourth transistor T4, and the fifth transistor T5 have been described in the foregoing embodiments, and details are not described herein again.

Figure 33:
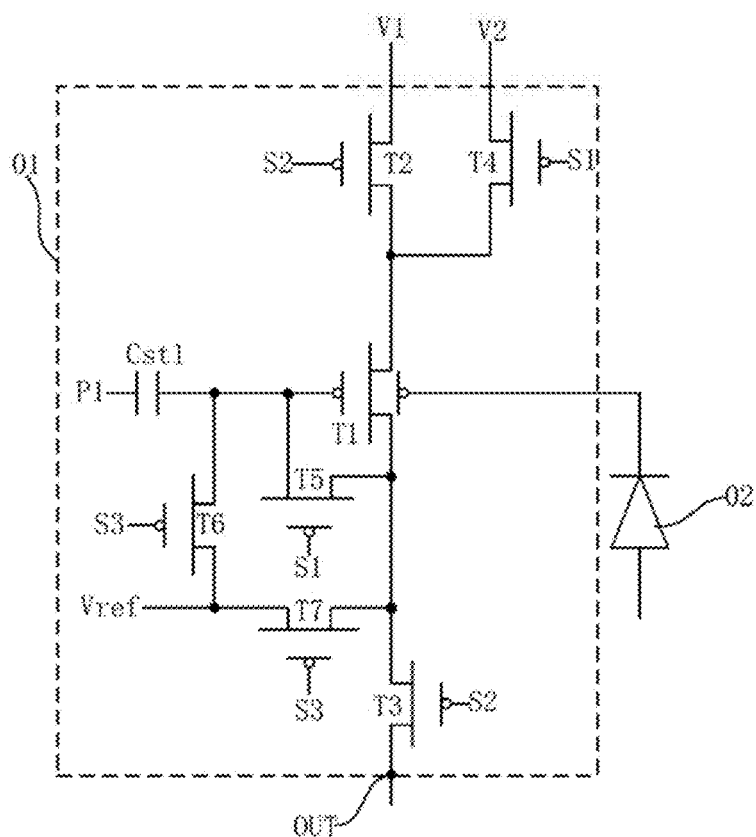
FIG. 33 is a schematic diagram of a sensing circuit according to an embodiment of the present disclosure.
Figure 34:
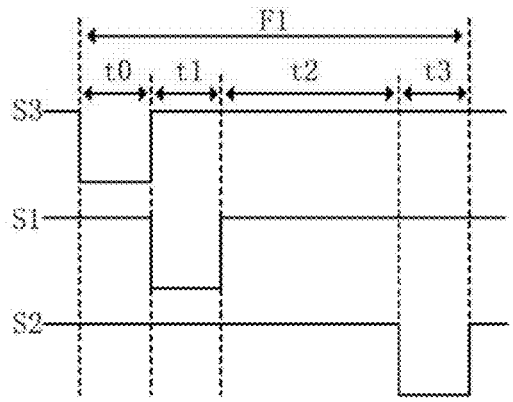
FIG. 34 is a working timing diagram corresponding to FIG. 33.

FIG. 33 is a schematic diagram of a sensing circuit according to an embodiment of the present disclosure. FIG. 34 is a working timing diagram corresponding to FIG. 33.

With reference to FIG. 33 and FIG. 34, in the example embodiment, the first transistor T1, the second transistor T2, the third transistor T3, the fourth transistor T4, and the fifth transistor T5 are P-channel transistors, a gate of the fourth transistor T4 and a gate of the fifth transistor T5 are both connected to a first scanning line S1, and a gate of the second transistor T2 and a gate of the third transistor T3 are both connected to a second scanning line S2.

At the bias compensation stage t1, the first scanning line S1 transmits a low-level enable signal. Both the fourth transistor T4 and the fifth transistor T5 are turned on, that is, the bias compensation circuit 12 is turned on. The second voltage V2 received by the input terminal of the fourth transistor T4 is transmitted to the second gate G2 of the first transistor T1 through the turned-on fourth transistor T4 and fifth transistor T5.

At the integration stage t2, neither of the first scanning line S1 and the second scanning line S2 transmits an enable signal. In this case, the second transistor T2, the third transistor T3, the fourth transistor T4, and the fifth transistor T5 are all turned off.

At the read stage t3, the second scanning line S2 transmits a low-level enable signal. In this case, both the second transistor T2 and the third transistor T3 are turned on. The first voltage V1 received by the input terminal of the second transistor T2 is transmitted to the input terminal of the first transistor T1. In this case, the first transistor T1 generates a current, and the current generated by the first transistor T1 is outputted by the output terminal OUT of the sensing circuit 01 through the turned-on third transistor T3. The magnitude of the current generated by the first transistor T1 depends on voltages of the first gate G1 and the second gate G2.

When the sensing circuit 01 further includes a first reset circuit 13, the first working cycle F1 further includes a reset stage t0. At the reset stage t0, the first reset circuit 13 is turned on to reset the second gate G2 of the first transistor T1.

With reference to FIG. 33 and FIG. 34, in an example embodiment, the first reset circuit 13 includes a sixth transistor T6. The sixth transistor T6 may also be a P-channel transistor, and a gate of the sixth transistor T6 is connected to a third scanning line S3.

At the reset stage t0, the third scanning line S3 transmits a low-level enable signal, and the sixth transistor T6 is turned on and transmits a reset voltage $V_{ref}$ received by an input terminal thereof to the second gate G2 of the first transistor T1, to reset the second gate G2 of the first transistor T1.

When the sensing circuit 01 further includes a second reset circuit 14, the second reset circuit 14 may also be turned on at the reset stage to simultaneously with the first reset circuit 13, to reset the output terminal of the first transistor T1. It should be noted that, the first reset circuit 13 and the second reset circuit 14 may be turned on simultaneously or may be turned on asynchronously. In this example embodiment of the present disclosure, the first reset circuit 13 and the second reset circuit 14 are turned on simultaneously.

With reference to FIG. 33 and FIG. 34, in an example embodiment, the second reset circuit 14 includes a seventh transistor T7. The seventh transistor T7 may also be a P-channel transistor, and a gate of the seventh transistor T7 is also connected to the third scanning line S3.

At the reset stage t0, the third scanning line S3 transmits a low-level enable signal, and the seventh transistor T7 is turned on and transmits a reset voltage $V_{ref}$ received by an input terminal thereof to the output terminal of the first transistor T1, to reset the output terminal of the first transistor T1.

Figure 35:
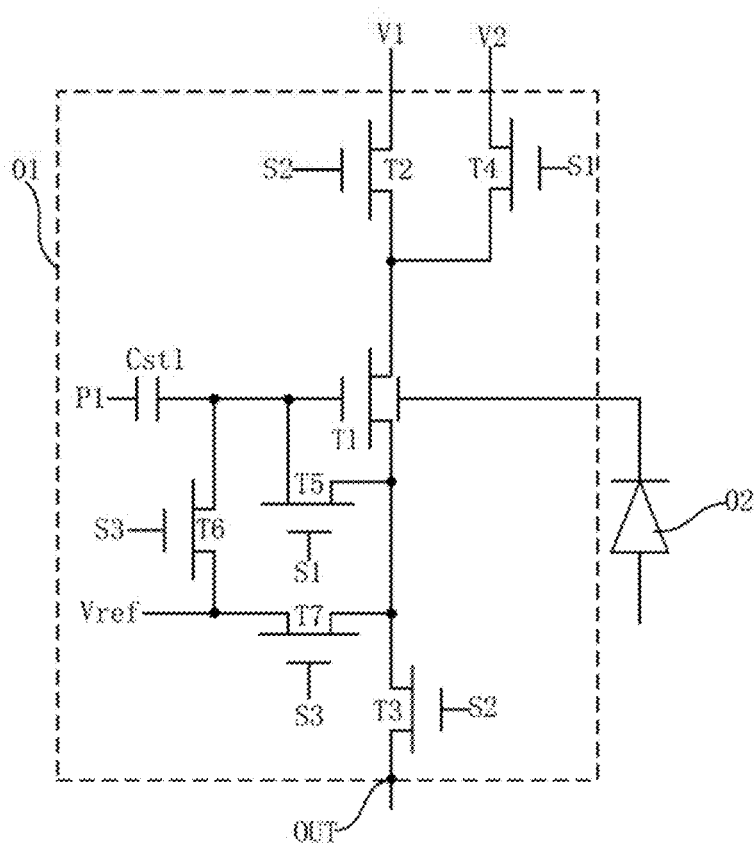
FIG. 35 is a schematic diagram of a sensing circuit according to an embodiment of the present disclosure.
Figure 36:
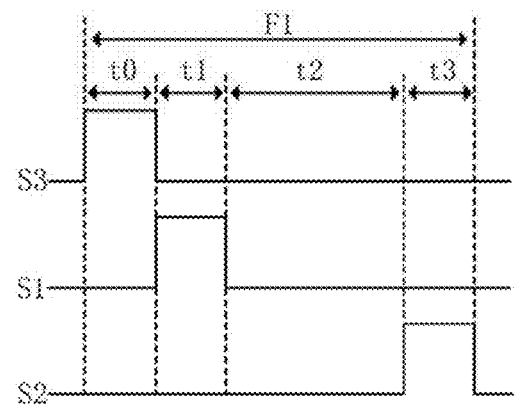
FIG. 36 is a working timing diagram corresponding to FIG. 35.

FIG. 35 is a schematic diagram of a sensing circuit according to an embodiment of the present disclosure. FIG. 36 is a working timing diagram corresponding to FIG. 35.

In the example embodiments of FIG. 35 and FIG. 36, the first transistor T1, the second transistor T2, the third transistor T3, the fourth transistor T4, and the fifth transistor T5 are N-channel transistors. A gate of the fourth transistor T4 and a gate of the fifth transistor T5 are both connected to a first scanning line S1, and a gate of the second transistor T2 and a gate of the third transistor T3 are both connected to a second scanning line S2.

At the bias compensation stage t1, the first scanning line S1 transmits a high-level enable signal. In this case, both the fourth transistor T4 and the fifth transistor T5 are turned on, that is, the bias compensation circuit 12 is turned on. The second voltage V2 received by the input terminal of the fourth transistor T4 is transmitted to the second gate G2 of the first transistor T1 through the turned-on fourth transistor T4 and turned-on fifth transistor T5.

At the integration stage t2, neither of the first scanning line S1 and the second scanning line S2 transmits an enable signal. In this case, the second transistor T2, the third transistor T3, the fourth transistor T4, and the fifth transistor T5 are all turned off.

At the read stage t3, the second scanning line S2 transmits a high-level enable signal. In this case, both the second transistor T2 and the third transistor T3 are turned on. The first voltage V1 received by the input terminal of the second transistor T2 is transmitted to the input terminal of the first transistor T1. The first transistor T1 generates a current, and the current generated by the first transistor T1 is outputted by the output terminal OUT of the sensing circuit 01 through the turned-on third transistor T3. The magnitude of the current generated by the first transistor T1 depends on voltages of the first gate G1 and the second gate G2 of the first transistor T1.

When the sensing circuit 01 further includes a first reset circuit 13, the first working cycle F1 further includes a reset stage t0. At the reset stage to, the first reset circuit 13 is turned on to reset the second gate G2 of the first transistor T1.

In the example embodiment of FIG. 35 and FIG. 36, the first reset module 13 includes a sixth transistor T6. The sixth transistor T6 may also be an N-channel transistor, and a gate of the sixth transistor T6 is connected to a third scanning line S3.

At the reset stage t0, the third scanning line S3 transmits a high-level enable signal, and the sixth transistor T6 is turned on and transmits a reset voltage $V_{ref}$ received by an input terminal thereof to the second gate G2 of the first transistor T1, to reset the second gate G2 of the first transistor T1.

When the sensing circuit 01 further includes a second reset circuit 14, the second reset circuit 14 is also turned on at the reset stage to at the same time as the first reset circuit 13, to reset the output terminal of the first transistor T1. It should be noted that, the first reset circuit 13 and the second reset circuit 14 may be turned on simultaneously or may be turned on asynchronously. In this example embodiment of the present disclosure, that the first reset circuit 13 and the second reset circuit 14 are turned on simultaneously.

In the example embodiment of FIG. 35 and FIG. 36, the second reset circuit 14 includes a seventh transistor T7. The seventh transistor T7 may also be an N-channel transistor, and a gate of the seventh transistor T7 is also connected to the third scanning line S3.

At the reset stage t0, the third scanning line S3 transmits a high-level enable signal, and the seventh transistor T7 is turned on and transmits a reset voltage $V_{ref}$ received by an input terminal thereof to the output terminal of the first transistor T1, to reset the output terminal of the first transistor T1.

Figure 37:
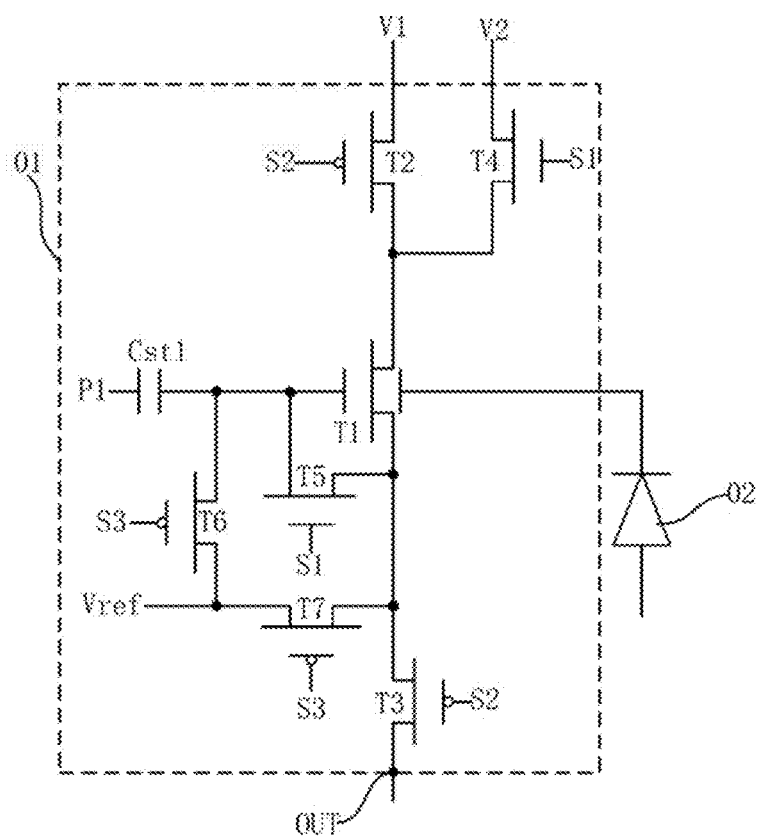
FIG. 37 is a schematic diagram of a sensing circuit according to an embodiment of the present disclosure.
Figure 38:
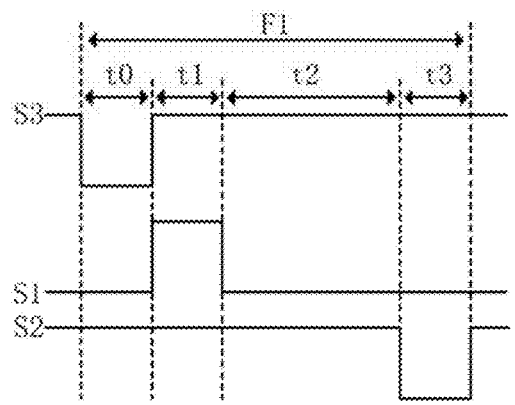
FIG. 38 is a working timing diagram corresponding to FIG. 37.

FIG. 37 is a schematic diagram of a sensing circuit according to an embodiment of the present disclosure. FIG. 38 is a working timing diagram corresponding to FIG. 37.

In the example embodiment of FIG. 37 and FIG. 38, the first transistor T1, the second transistor T2, the third transistor T3, the fourth transistor T4, and the fifth transistor T5 are N-channel transistors. A gate of the fourth transistor T4 and a gate of the fifth transistor T5 are both connected to a first scanning line S1, and a gate of the second transistor T2 and a gate of the third transistor T3 are both connected to a second scanning line S2.

At the bias compensation stage t1, the first scanning line S1 transmits a high-level enable signal. In this case, both the fourth transistor T4 and the fifth transistor T5 are turned on, that is, the bias compensation circuit 12 is turned on. The second voltage V2 received by the input terminal of the fourth transistor T4 is transmitted to the second gate G2 of the first transistor T1 through the turned-on fourth transistor T4 and turned-on fifth transistor T5.

At the integration stage t2, neither of the first scanning line S1 and the second scanning line S2 transmits an enable signal. In this case, the second transistor T2, the third transistor T3, the fourth transistor T4, and the fifth transistor T5 are all turned off.

At the read stage t3, the second scanning line S2 transmits a low-level enable signal. Both the second transistor T2 and the third transistor T3 are turned on. The first voltage V1 received by the input terminal of the second transistor T2 is transmitted to the input terminal of the first transistor T1. The first transistor T1 generates a current, and the current generated by the first transistor T1 is outputted by the output terminal OUT of the sensing circuit 01 through the turned-on third transistor T3. The magnitude of the current generated by the first transistor T1 depends on voltages of the first gate G1 and the second gate G2.

When the sensing circuit 01 further includes a first reset circuit 13, the first working cycle F1 further includes a reset stage t0. At the reset stage t0, the first reset circuit 13 is turned on to reset the second gate G2 of the first transistor T1.

In the example embodiment of FIG. 37 and FIG. 38, the first reset circuit 13 includes a sixth transistor T6. The sixth transistor T6 is a P-channel transistor, and a gate of the sixth transistor T6 is connected to a third scanning line S3.

At the reset stage t0, the third scanning line S3 transmits a low-level enable signal, and the sixth transistor T6 is turned on and transmits a reset voltage $V_{ref}$ received by an input terminal thereof to the second gate G2 of the first transistor T1, to reset the second gate G2 of the first transistor T1.

When the sensing circuit 01 further includes a second reset circuit 14, the second reset circuit 14 may also be turned on at the reset stage to at the same time as the first reset circuit 13, to reset the output terminal of the first transistor T1. It should be noted that, the first reset circuit 13 and the second reset circuit 14 may be turned on simultaneously or may be turned on asynchronously. In this example embodiment of the present disclosure, that the first reset circuit 13 and the second reset circuit 14 are turned on simultaneously.

In the example embodiment of FIG. 37 and FIG. 38, the second reset circuit 14 includes a seventh transistor T7. The seventh transistor T7 may be a P-channel transistor, and a gate of the seventh transistor T7 is also connected to the third scanning line S3.

At the reset stage t0, the third scanning line S3 transmits a low-level enable signal, and the seventh transistor T7 is turned on and transmits a reset voltage $V_{ref}$ received by an input terminal thereof to the output terminal of the first transistor T1, to reset the output terminal of the first transistor T1.

To clearly describe the working process of the sensing circuit 01, the working timing of the transistors in the sensing circuit 01 is described in the foregoing embodiments. It should be noted that, the sensing circuit includes a plurality of transistors, and the plurality of transistors may be implemented with different channel-type combinations, but only some of the combinations are described in the foregoing embodiments. However, the present disclosure also protects other sensing circuits in which a transistor is are simply replaced by a transistor with a different channel type.

Figure 39:
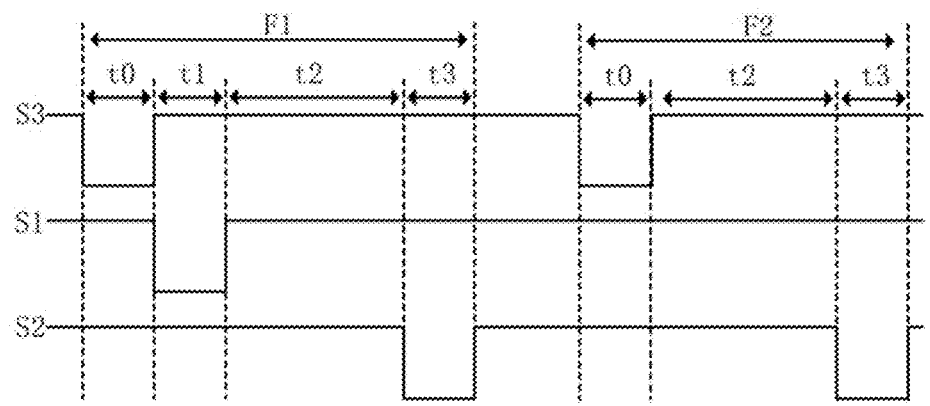
FIG. 39 is a working timing diagram corresponding to FIG. 33.
Figure 40:
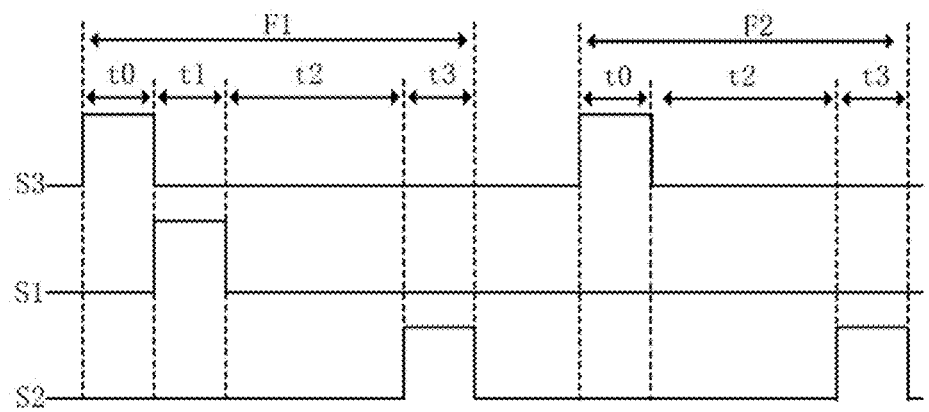
FIG. 40 is a working timing diagram corresponding to FIG. 35.
Figure 41:
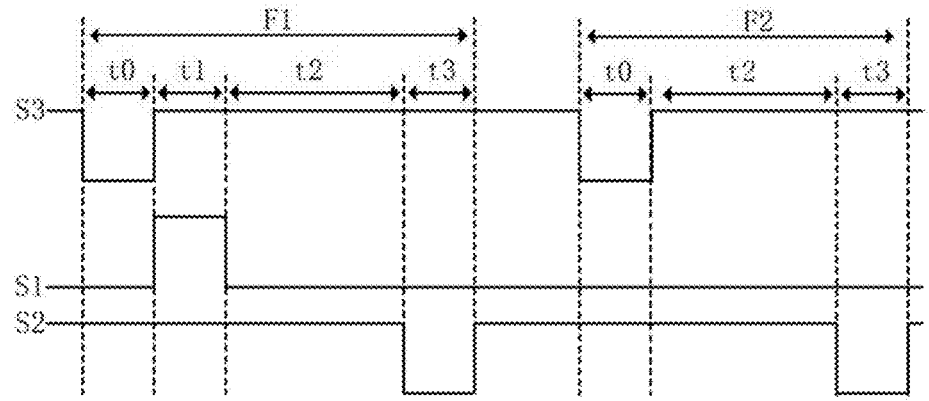
FIG. 41 is a working timing diagram corresponding to FIG. 37.

FIG. 39 is a working timing diagram corresponding to FIG. 33. FIG. 40 is a working timing diagram corresponding to FIG. 35. FIG. 41 is a working timing diagram corresponding to FIG. 37.

In an embodiment of the present disclosure, with reference to FIG. 33 and FIG. 39, FIG. 35 and FIG. 40, and FIG. 37 and FIG. 41, the plurality of working cycles of the sensing circuit 01 include at least one second working cycle F2. The second working cycle F2 includes an integration stage t2 (also referred to as the second integration stage) and a read stage t3 (also referred to as the second read stage). Compared with the first working cycle F1, the second working cycle F2 does not include the compensation stage t1.

At the integration stage t2 of the second working cycle F2, both the bias compensation circuit 12 and the read circuit 11 are turned off, and the first gate G1 of the first transistor T1 receives the sensing signal outputted by the sensor 02. At the read stage t3 of the second working cycle F2, the read circuit 11 is turned on, and the output terminal of the first transistor T1 is electrically connected to the output terminal of the sensing circuit 01.

When the sensing circuit 01 further includes a first reset circuit 13, the second working cycle F2 may further include a reset stage t0. At the reset stage to of the second working cycle F2, the first reset circuit 13 is turned on to reset the second gate G2 of the first transistor T1.

When the sensing circuit 01 further includes a second reset circuit 14, at the reset stage t0 of the second working cycle F2, the second reset circuit 14 is turned on to reset the output terminal of the first transistor T1.

In this embodiment, the first working cycle F1 of the sensing circuit 01 includes the bias compensation stage t1, the second working cycle F2 of the sensing circuit 01 does not include the bias compensation stage t1, and the first working cycle F1 and the second working cycle F2 of the sensing circuit 01 both include the integration stage t2 and the read stage t3. Therefore, frequencies of the integration stage t2 and the read stage t3 of the sensing circuit 01 are both greater than a frequency of the bias compensation stage t1. In this way, power consumption can be reduced and a relatively high detection frequency can be obtained. When the detection frequency of the sensing circuit 01 is relatively high, the threshold drift of the first transistor T1 in adjacent working cycles is not obvious. In this case, the frequency of the bias compensation stage t1 may be set to be less than the frequencies of the integration stage t2 and the read stage t3. In this way, power consumption can be reduced.

In an example, a frequency of the second working cycle F2 is greater than or equal to a frequency of the first working cycle F1.

When the frequency of the second working cycle F2 is equal to the frequency of the first working cycle F1, it means that the second working cycle F2 and the first working cycle F1 are performed alternately.

When the frequency of the second working cycle F2 is greater than the frequency of the first working cycle F1, it means that there are at least two second working cycles F2 between two adjacent first working cycles F1.

Figure 42:
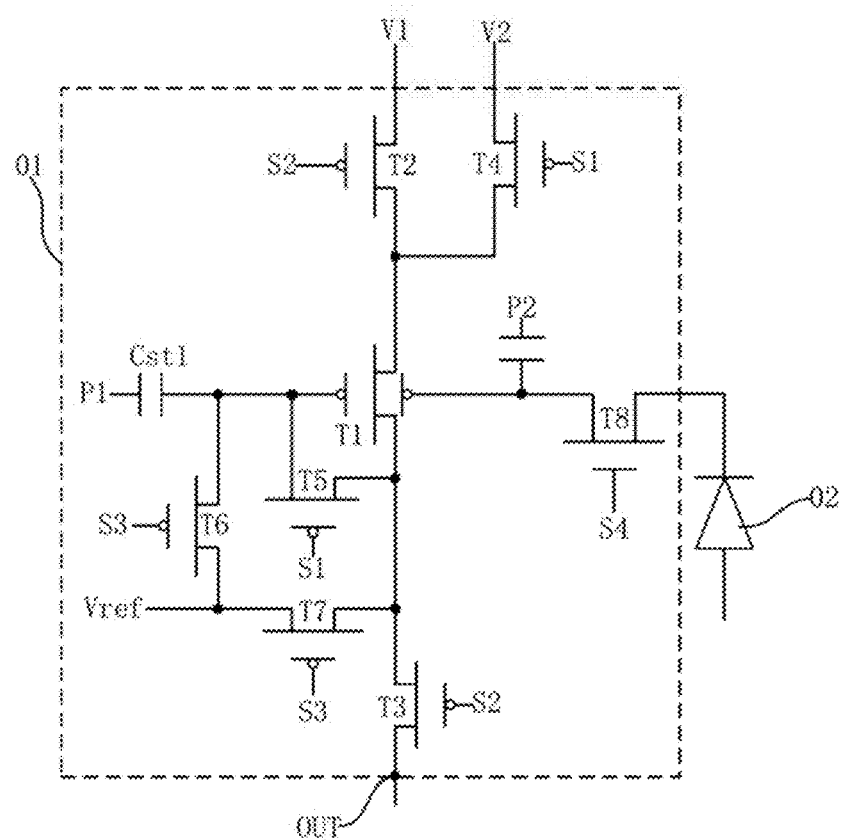
FIG. 42 is a schematic diagram of a sensing circuit according to an embodiment of the present disclosure.
Figure 43:
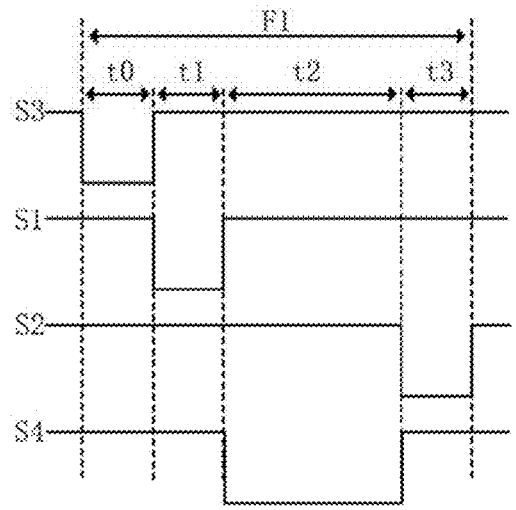
FIG. 43 is a working timing diagram corresponding to FIG. 42.

FIG. 42 is a schematic diagram of a sensing circuit according to an embodiment of the present disclosure. FIG. 43 is a working timing diagram corresponding to FIG. 42.

In an embodiment of the present disclosure, the sensing circuit further includes a control circuit 15. An input terminal of the control circuit 15 receives the sensing signal outputted by the sensor 02, and an output terminal of the control circuit 15 is electrically connected to the first gate G1 of the first transistor T1. The sensing method further includes: at the integration stage t2, turning on the control circuit 15. The control circuit 15 is configured to transmit, to the first gate G1 of the first transistor T1, the sensing signal outputted by the sensor 02.

In the example embodiment of FIG. 42 and FIG. 43, the control circuit 15 includes an eighth transistor T8, and the first transistor T1, the second transistor T2, the third transistor T3, the fourth transistor T4, the fifth transistor T5, the sixth transistor T6, the seventh transistor T7, and the eighth transistor T8 are all P-channel transistors. A gate of the eighth transistor T8 is connected to a fourth scanning line S4.

At the reset stage t0, the third scanning line S3 transmits a low-level enable signal. The seventh transistor T7 is turned on and transmits the reset voltage $V_{ref}$ received by its input terminal to the output terminal of the first transistor T1, to reset the output terminal of the first transistor T1. The sixth transistor T6 is turned on and transmits the reset voltage $V_{ref}$ received by its input terminal to the second gate G2 of the first transistor T1, to reset the second gate G2 of the first transistor T1.

At the bias compensation stage t1, the first scanning line S1 transmits a low-level enable signal. In this case, both the fourth transistor T4 and the fifth transistor T5 are turned on, that is, the bias compensation circuit 12 is turned on. The second voltage V2 received by the input terminal of the fourth transistor T4 is transmitted to the second gate G2 of the first transistor T1 through the turned-on fourth transistor T4 and turned-on fifth transistor T5.

At the integration stage t2, the fourth scanning line S4 transmits a low-level enable signal. In this case, the eighth transistor T8 is turned on, that is, the control circuit 15 is turned on. The eighth transistor T8 transmits, to the first gate G1 of the first transistor T1, the sensing signal outputted by the sensor 02.

At the read stage t3, the second scanning line S2 transmits a low-level enable signal. In this case, both the second transistor T2 and the third transistor T3 are turned on. The first voltage V1 received by the input terminal of the second transistor T2 is transmitted to the input terminal of the first transistor T1. In this case, the first transistor T1 generates a current, and the current generated by the first transistor T1 is outputted by the output terminal OUT of the sensing circuit 01 through the turned-on third transistor T3. The magnitude of the current generated by the first transistor T1 depends on voltages of the first gate G1 and the second gate G2 of the first transistor T1.

Figure 44:
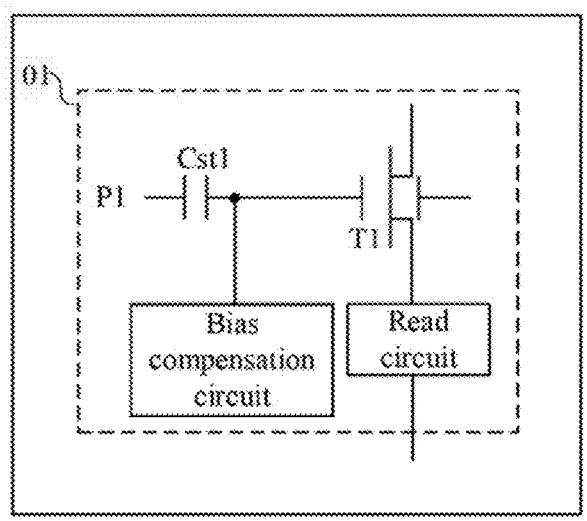
FIG. 44 is a schematic diagram of a sensor chip according to an embodiment of the present disclosure.

FIG. 44 is a schematic diagram of a sensor chip according to an embodiment of the present disclosure.

An embodiment of the present disclosure provides a sensor chip. As shown in FIG. 42, the sensor chip includes the sensing circuit 01 provided in any one of the foregoing embodiments.

The sensor chip provided in this embodiment of the present disclosure has a high sensing sensitivity.

Figure 45:
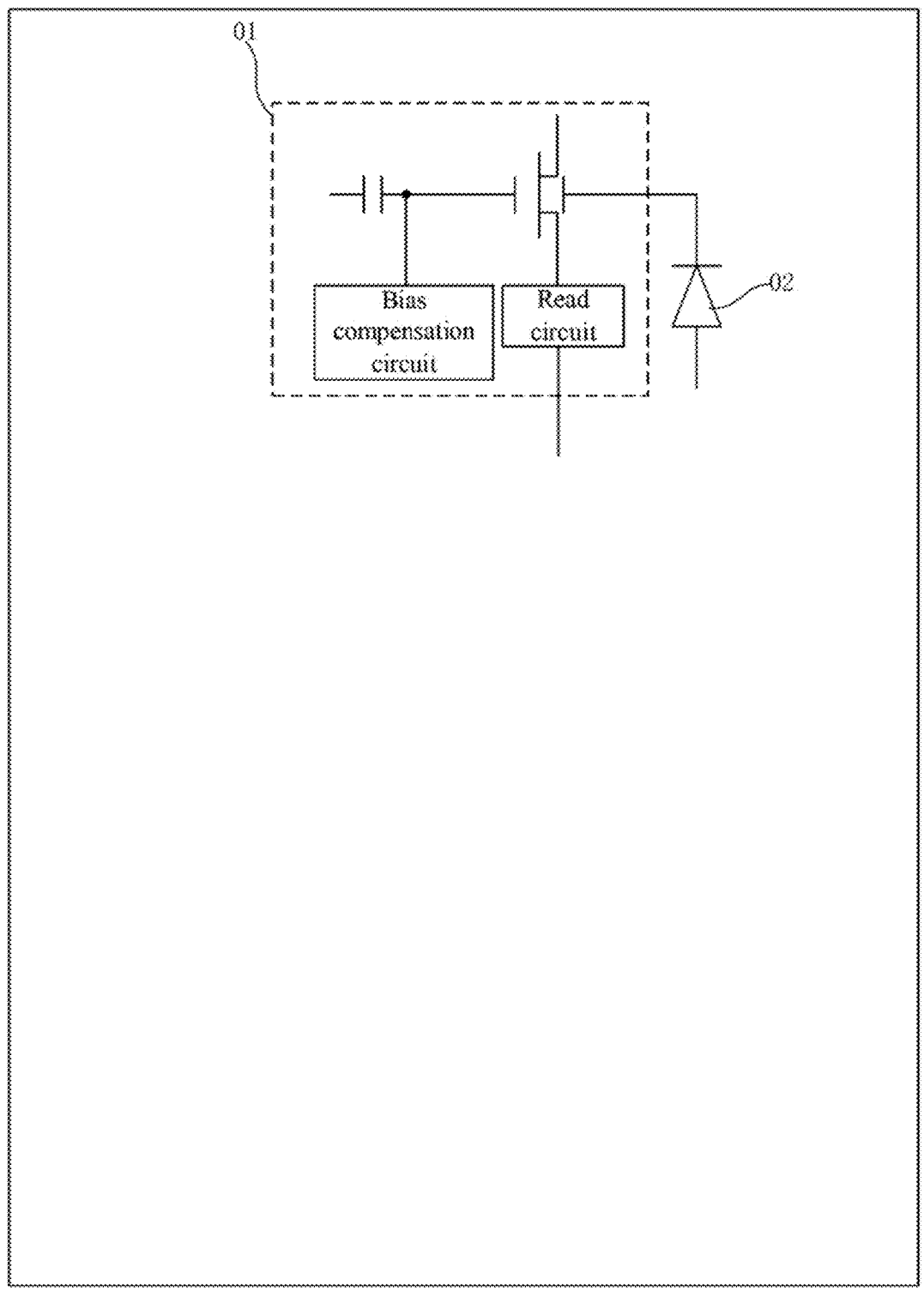
FIG. 45 is a schematic diagram of a display panel according to an embodiment of the present disclosure.

FIG. 45 is a schematic diagram of a display panel according to an embodiment of the present disclosure.

An embodiment of the present disclosure provides a display panel 001. The display panel 001 includes the sensing circuit 01 provided in any one of the foregoing embodiments. In addition, the display panel 001 may further include a sensor 02.

The display panel provided in this embodiment of the present disclosure has a high sensing sensitivity.

Figure 46:
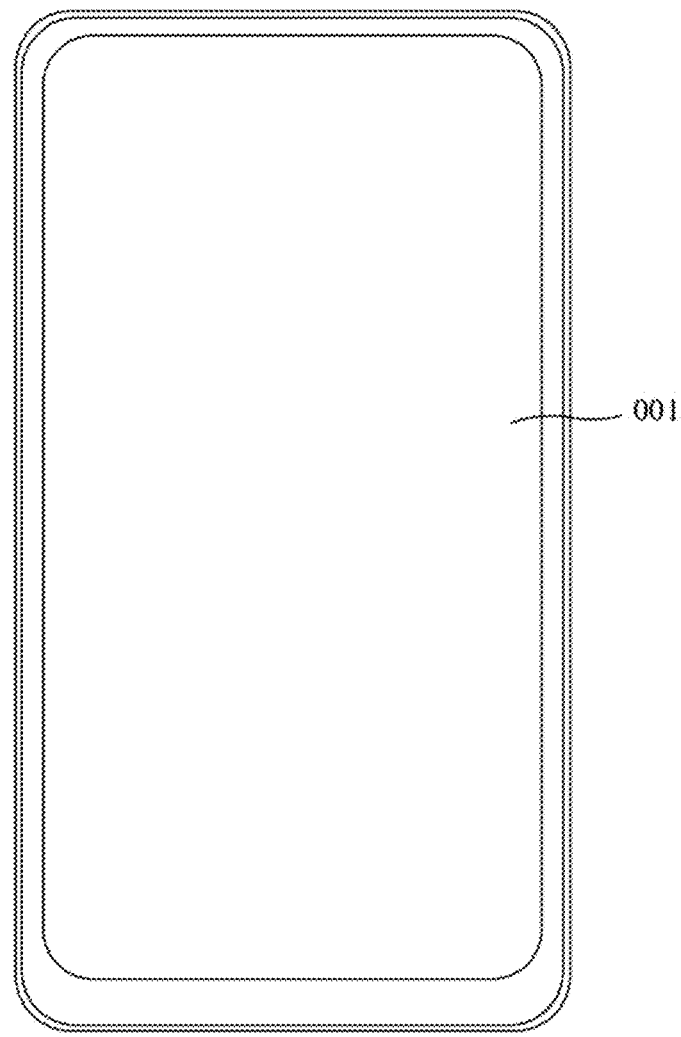
FIG. 46 is a schematic diagram of a display apparatus according to an embodiment of the present disclosure.

FIG. 46 is a schematic diagram of a display apparatus according to an embodiment of the present disclosure.

An embodiment of the present disclosure further provides a display apparatus. As shown in FIG. 46, the display apparatus includes the display panel 001 according to any one of the foregoing embodiments. For example, the display apparatus may be an electronic device such as a mobile phone, a computer, an intelligent wearable device (for example, a smart watch), and an in-vehicle display device. This is not limited in the embodiments of the present disclosure.

The display apparatus provided in this embodiment of the present disclosure can maintain a highly sensitive detection state.

The above descriptions are merely preferred embodiments of the present disclosure and are not intended to limit the present disclosure. Any modification, equivalent replacement and improvement within the spirit and principle of the present disclosure shall be included within the protection scope of the present disclosure.

What is claimed is:

1. A sensing circuit comprising:
a first transistor comprising a channel region, a first gate, and a second gate, wherein the first gate is configured to receive a sensing signal outputted by a sensor;
a first capacitor comprising a first plate electrically connected to the second gate of the first transistor, and a second plate electrically connected to a first fixed potential signal terminal;
a read circuit electrically connected to the first transistor and configured to control the first transistor to output a sensing current to an output terminal of the sensing circuit; and
a bias compensation circuit electrically connected to the first transistor and configured to input a bias voltage into the second gate of the first transistor.

2. The sensing circuit according to claim 1, wherein a side of the first gate away from the channel region of the first transistor is provided with a first insulating layer, wherein the first insulating layer is provided with a first via hole, and
wherein the first gate receives, through a conductive structure provided in the first via hole, the sensing signal output by the sensor.

3. The sensing circuit according to claim 1, wherein a capacitance value C1 per unit area between the first gate and the channel region of the first transistor and a capacitance value C2 per unit area between the second gate and the channel region of the first transistor is C2 satisfy: C1/C2≥1.

4. The sensing circuit according to claim 3, wherein a second insulating layer is sandwiched between the first gate and the channel region of the first transistor, and a third insulating layer is sandwiched between the second gate and the channel region of the first transistor,
wherein a dielectric constant of the second insulating layer is greater than a dielectric constant of the third insulating layer.

5. The sensing circuit according to claim 3, wherein a distance between the first gate and the channel region of the first transistor is less than a distance between the second gate and the channel region of the first transistor.

6. The sensing circuit according to claim 1, wherein the read circuit comprises a second transistor and a third transistor,
the second transistor comprises an input terminal for receiving a first voltage, and an output terminal electrically connected to an input terminal of the first transistor, and
the third transistor comprises an input terminal electrically connected to an output terminal of the first transistor, and an output terminal electrically connected to the output terminal of the sensing circuit.

7. The sensing circuit according to claim 1, wherein the bias compensation circuit comprises a fourth transistor and a fifth transistor,
the fourth transistor comprises an input terminal for receiving a second voltage, and an output terminal electrically connected to an input terminal of the first transistor, and
the fifth transistor comprises an input terminal electrically connected to an output terminal of the first transistor, and an output terminal electrically connected to the second gate of the first transistor.

8. The sensing circuit according to claim 7, further comprising a first reset circuit electrically connected to the second gate of the first transistor, wherein the first reset circuit is configured to reset the second gate of the first transistor.

9. The sensing circuit according to claim 8, wherein the first reset circuit comprises a sixth transistor, wherein the sixth transistor comprises an input terminal for receiving a reset voltage, and an output terminal electrically connected to the second gate of the first transistor.

10. The sensing circuit according to claim 9, wherein at least one of the first transistor, the fifth transistor, or the sixth transistor comprises a metal oxide semiconductor layer.

11. The sensing circuit according to claim 8, further comprising a second reset circuit electrically connected to the output terminal of the first transistor, wherein the second reset circuit is configured to reset the output terminal of the first transistor.

12. The sensing circuit according to claim 11, wherein the second reset circuit comprises a seventh transistor, wherein the seventh transistor comprises an input terminal for receiving the reset voltage, and an output terminal electrically connected to the output terminal of the first transistor.

13. The sensing circuit according to claim 1, further comprising a control circuit, wherein the control circuit comprises an input terminal for receiving the sensing signal output by the sensor, and an output terminal electrically connected to the first gate of the first transistor.

14. The sensing circuit according to claim 13, wherein the control circuit comprises an eighth transistor and a second capacitor,
   wherein the eighth transistor comprises an input terminal for receiving the sensing signal outputted by the sensor, and an output terminal electrically connected to the first gate of the first transistor, and
   the second capacitor comprises a first plate electrically connected to the output terminal of the eighth transistor, and a second plate electrically connected to a second fixed potential signal terminal.

15. A sensing method configured to sense, through the sensing circuit according to claim 1, a sensing signal output by a sensor, the method having a plurality of working cycles, the plurality of working cycles comprising at least one first working cycle, each first working cycle comprising a bias compensation stage, a first integration stage, and a first read stage, and the method comprising:
   at the bias compensation stage, turning on the bias compensation circuit, and inputting the bias voltage into the second gate of the first transistor;
   at the first integration stage, turning off both the bias compensation circuit and the read circuit, and inputting the sensing signal outputted by the sensor into the first gate of the first transistor; and
   at the first read stage, turning on the read circuit, and connecting the output terminal of the first transistor to the output terminal of the sensing circuit.

16. The sensing method according to claim 15, wherein the plurality of working cycles further comprise at least one second working cycle, each second working cycle comprises a second integration stage and a second read stage, and the sensing method further comprises:
   at the second integration stage, turning off both the bias compensation circuit and the read circuit, and inputting the sensing signal outputted by the sensor into the first gate of the first transistor; and
   at the second read stage, turning on the read circuit, and connecting the output terminal of the first transistor to the output terminal of the sensing circuit.

17. The sensing method according to claim 16, wherein a frequency of the at least one second working cycle is greater than or equal to a frequency of the at least one first working cycle.

18. The sensing method according to claim 15, wherein the sensing circuit further comprises a control circuit comprising an input terminal for receiving the sensing signal output by the sensor and an output terminal electrically connected to the first gate of the first transistor, and wherein the sensing method further comprises, at the integration stage, turning on the control circuit.

19. A sensor chip comprising:
   a sensing circuit, including:
      a first transistor comprising a channel region, a first gate, and a second gate, wherein the first gate is configured to receive a sensing signal outputted by a sensor;
      a first capacitor comprising a first plate electrically connected to the second gate of the first transistor, and a second plate electrically connected to a first fixed potential signal terminal;
      a read circuit electrically connected to the first transistor and configured to control the first transistor to output a sensing current to an output terminal of the sensing circuit; and
      a bias compensation circuit electrically connected to the first transistor and configured to input a bias voltage into the second gate of the first transistor.

20. A display panel comprising:
a sensing circuit, including:
   a first transistor comprising a channel region, a first gate, and a second gate, wherein the first gate is configured to receive a sensing signal outputted by a sensor;
   a first capacitor comprising a first plate electrically connected to the second gate of the first transistor, and a second plate electrically connected to a first fixed potential signal terminal;
   a read circuit electrically connected to the first transistor and configured to control the first transistor to output a sensing current to an output terminal of the sensing circuit; and
   a bias compensation circuit electrically connected to the first transistor and configured to input a bias voltage into the second gate of the first transistor.

* * * * *